(12) United States Patent
Kim et al.

(10) Patent No.: US 11,569,237 B2
(45) Date of Patent: Jan. 31, 2023

(54) SEMICONDUCTOR DEVICE

(71) Applicant: SAMSUNG ELECTRONICS CO., LTD., Suwon-si (KR)

(72) Inventors: Ju Youn Kim, Suwon-si (KR); Sang Jung Kang, Suwon-si (KR); Ji Su Kang, Seoul (KR); Yun Sang Shin, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/569,950

(22) Filed: Jan. 6, 2022

(65) Prior Publication Data

US 2022/0130827 A1 Apr. 28, 2022

Related U.S. Application Data

(63) Continuation of application No. 17/032,425, filed on Sep. 25, 2020, now Pat. No. 11,222,894.

(30) Foreign Application Priority Data

Apr. 20, 2020 (KR) .................. 10-2020-0047173

(51) Int. Cl.
*H01L 27/092* (2006.01)
*H01L 29/06* (2006.01)
(Continued)

(52) U.S. Cl.
CPC .... *H01L 27/0924* (2013.01); *H01L 21/76224* (2013.01); *H01L 21/823821* (2013.01);
(Continued)

(58) Field of Classification Search
CPC ............. H01L 21/02603; H01L 21/762; H01L 21/76224; H01L 21/823431; H01L 21/823481; H01L 21/823821; H01L 21/823878; H01L 21/845; H01L 27/0886; H01L 27/0924; H01L 27/10879; H01L 27/1211; H01L 29/0649; H01L 29/0653; H01L 29/0665; H01L 29/0669;
(Continued)

(56) References Cited

U.S. PATENT DOCUMENTS 6,722,434 B2 4/2004 Reddy et al.
6,784,018 B2 8/2004 Campbell et al.
(Continued)

*Primary Examiner* — David C Spalla
(74) *Attorney, Agent, or Firm* — Lee IP Law, P.C.

(57) ABSTRACT

A semiconductor device includes a substrate including NMOS and PMOS regions; first and second active patterns on the NMOS region; third and fourth active patterns on the PMOS region, the third active pattern being spaced apart from the first active pattern; a first dummy gate structure on the first and third active patterns; a second dummy gate structure on the second and fourth active patterns; a normal gate structure on the third active pattern; a first source/drain pattern on the third active pattern and between the normal gate structure and the first dummy gate structure; and a first element separation structure between the first and second dummy gate structures and separating the third and fourth (Continued)

active patterns, wherein the first dummy gate structure includes a first dummy insulation gate intersecting the third active pattern.

20 Claims, 34 Drawing Sheets

(51) Int. Cl.
*H01L 29/78* (2006.01)
*H01L 21/8238* (2006.01)
*H01L 29/786* (2006.01)
*H01L 29/66* (2006.01)
*H01L 21/762* (2006.01)
*H01L 29/423* (2006.01)

(52) U.S. Cl.
CPC .. *H01L 21/823878* (2013.01); *H01L 29/0653* (2013.01); *H01L 29/0673* (2013.01); *H01L 29/42392* (2013.01); *H01L 29/66545* (2013.01); *H01L 29/7851* (2013.01); *H01L 29/78696* (2013.01)

(58) Field of Classification Search
CPC ........... H01L 29/0673; H01L 29/41791; H01L 29/42392; H01L 29/66439; H01L 29/66545; H01L 29/66795; H01L 29/6681; H01L 29/775; H01L 29/785; H01L 29/7851; H01L 29/7853; H01L 29/7855; H01L 29/78696; H01L 2029/7858

See application file for complete search history.

(56) References Cited

U.S. PATENT DOCUMENTS

| | | | |
|---|---|---|---|
| 6,902,987 B1 | 6/2005 | Tong et al. | |
| 7,094,369 B2 | 8/2006 | Buiser et al. | |
| 7,137,354 B2 | 11/2006 | Collins et al. | |
| 9,368,496 B1* | 6/2016 | Yu | H01L 29/7855 |
| 9,406,676 B2 | 8/2016 | Yu et al. | |
| 9,755,079 B2* | 9/2017 | Park | H01L 27/1211 |
| 9,831,272 B2 | 11/2017 | Chen et al. | |
| 9,865,704 B2* | 1/2018 | Xie | H01L 21/823431 |
| 10,134,734 B2 | 11/2018 | Yuan et al. | |
| 10,269,928 B2 | 4/2019 | Hong et al. | |
| 10,505,546 B2 | 12/2019 | Song et al. | |
| 2015/0054089 A1* | 2/2015 | Hong | H01L 27/0924 257/401 |
| 2017/0200651 A1* | 7/2017 | Lee | H01L 21/823481 |
| 2017/0338229 A1* | 11/2017 | Oh | H01L 27/092 |
| 2019/0355719 A1 | 11/2019 | Maeda et al. | |

* cited by examiner

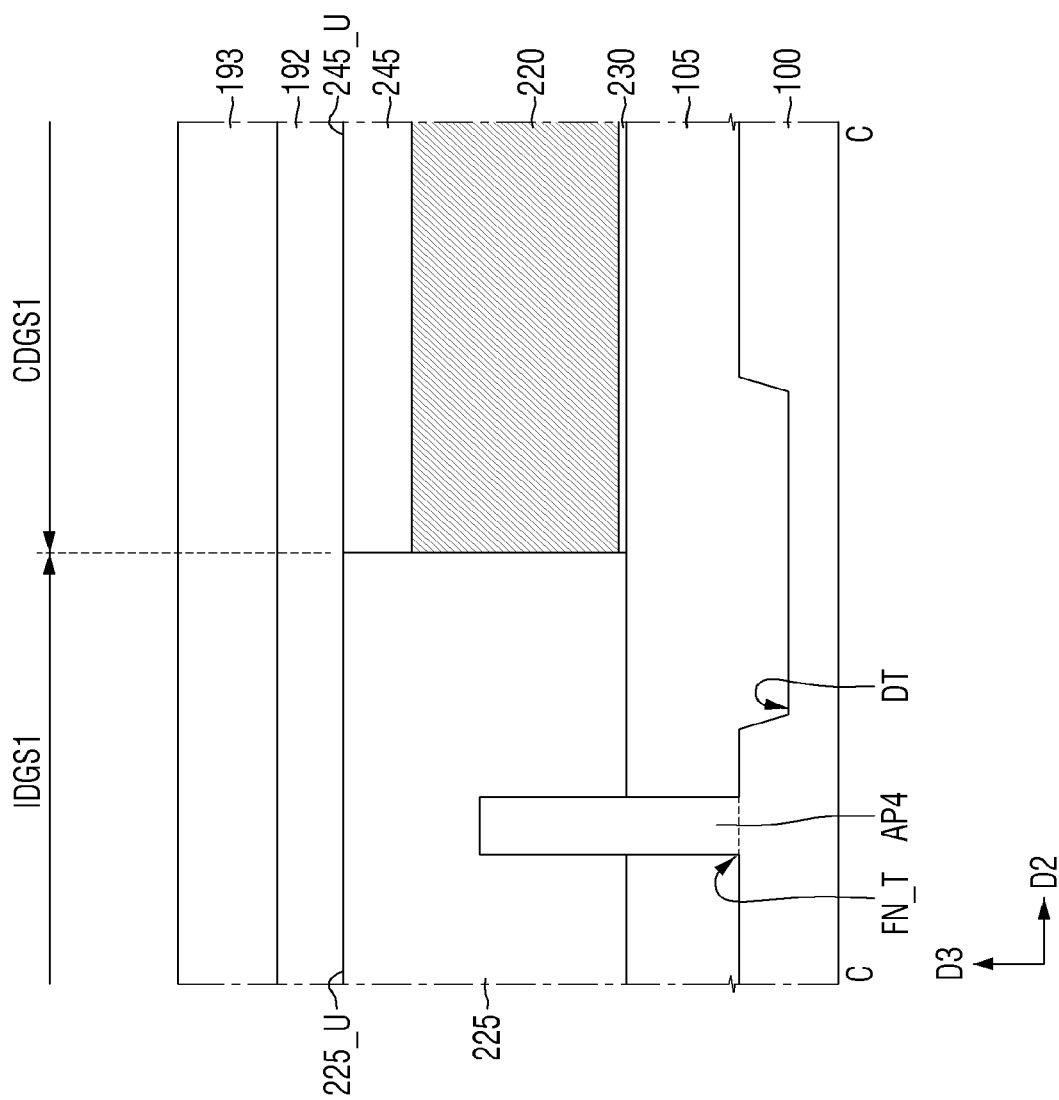

SEMICONDUCTOR DEVICE

CROSS-REFERENCE TO RELATED APPLICATIONS

This is a continuation application based on application Ser. No. 17/032,425, filed Sep. 25, 2020, the entire contents of which is hereby incorporated by reference.

Korean Patent Application No. 10-2020-0047173, filed on Apr. 20, 2020, in the Korean Intellectual Property Office, and entitled: "Semiconductor Device," is incorporated by reference herein in its entirety.

BACKGROUND

1. Field

Embodiments relate to a semiconductor device.

2. Description of the Related Art

As one of scaling techniques for increasing density of a semiconductor device, a multi-gate transistor in which a multi-channel active pattern (or a silicon body) having a fin or nanowire shape formed on a substrate and a gate formed on a surface of the multi-channel active pattern has been considered.

SUMMARY

The embodiments may be realized by providing a semiconductor device including a substrate including an NMOS formation region and a PMOS formation region; a field insulation film on the substrate; a first active pattern and a second active pattern on the NMOS formation region, spaced apart from each other in a first direction by the field insulation film, and each extending in the first direction; a third active pattern and a fourth active pattern on the PMOS formation region and each extending in the first direction, the third active pattern being spaced apart from the first active pattern in a second direction intersecting the first direction; a first dummy gate structure on the first active pattern and the third active pattern and extending in the second direction; a second dummy gate structure on the second active pattern and the fourth active pattern and extending in the second direction; a normal gate structure extending in the second direction on the third active pattern; a first source/drain pattern on the third active pattern and between the normal gate structure and the first dummy gate structure; and a first element separation structure between the first dummy gate structure and the second dummy gate structure and separating the third active pattern and the fourth active pattern, wherein the first dummy gate structure includes a first dummy insulation gate intersecting the third active pattern.

The embodiments may be realized by providing a semiconductor device including a first active pattern, a second active pattern, and third active pattern spaced apart from each other and arranged in a horizontal direction; a first element separation structure separating the first active pattern and the second active pattern; a second element separation structure that separates the second active pattern and the third active pattern; at least one first conductive gate on the first active pattern; at least one second conductive gate on the second active pattern; a first source/drain pattern on the first active pattern at one side of the at least one first conductive gate; and a second source/drain pattern on the second active pattern at one side of the at least one second conductive gate, wherein one first conductive gate of the at least one first conductive gate is closest to the first element separation structure in the horizontal direction, a distance between a width center of the one first conductive gate of the at least one first conductive gate and a width center of the first element separation structure in the horizontal direction is greater than a gate pitch, and a height of an upper surface of the first element separation structure in a vertical direction from an upper surface of the first active pattern is the same as or higher than a height of an upper surface of the at least one first conductive gate in the vertical direction from the upper surface of the first active pattern.

The embodiments may be realized by providing a semiconductor device including a field insulation film; a first lower active pattern and a second lower active pattern spaced apart from each other in a first direction by the field insulation film, each of the first lower active pattern and the second lower active pattern extending in the first direction; a first sheet pattern spaced apart from the first lower active pattern on the first lower active pattern; a second sheet pattern spaced apart from the second lower active pattern on the second lower active pattern; a third lower active pattern spaced apart from the first lower active pattern in a second direction intersecting the first direction, the third lower active pattern extending in the first direction; a fourth lower active pattern spaced apart from the third lower active pattern in the first direction and extending in the first direction; a third sheet pattern spaced apart from the third lower active pattern on the third lower active pattern; a fourth sheet pattern spaced apart from the fourth lower active pattern on the fourth lower active pattern; a first dummy gate structure on the first lower active pattern and the third lower active pattern and extending in the second direction; a second dummy gate structure on the second lower active pattern and the fourth lower active pattern and extending in the second direction; and a first element separation structure between the first dummy gate structure and the second dummy gate structure, the first element separation structure separating the third lower active pattern and the fourth lower active pattern, wherein the first dummy gate structure includes a first dummy insulation gate that intersects the third lower active pattern, and the first dummy insulation gate wraps the third sheet pattern.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
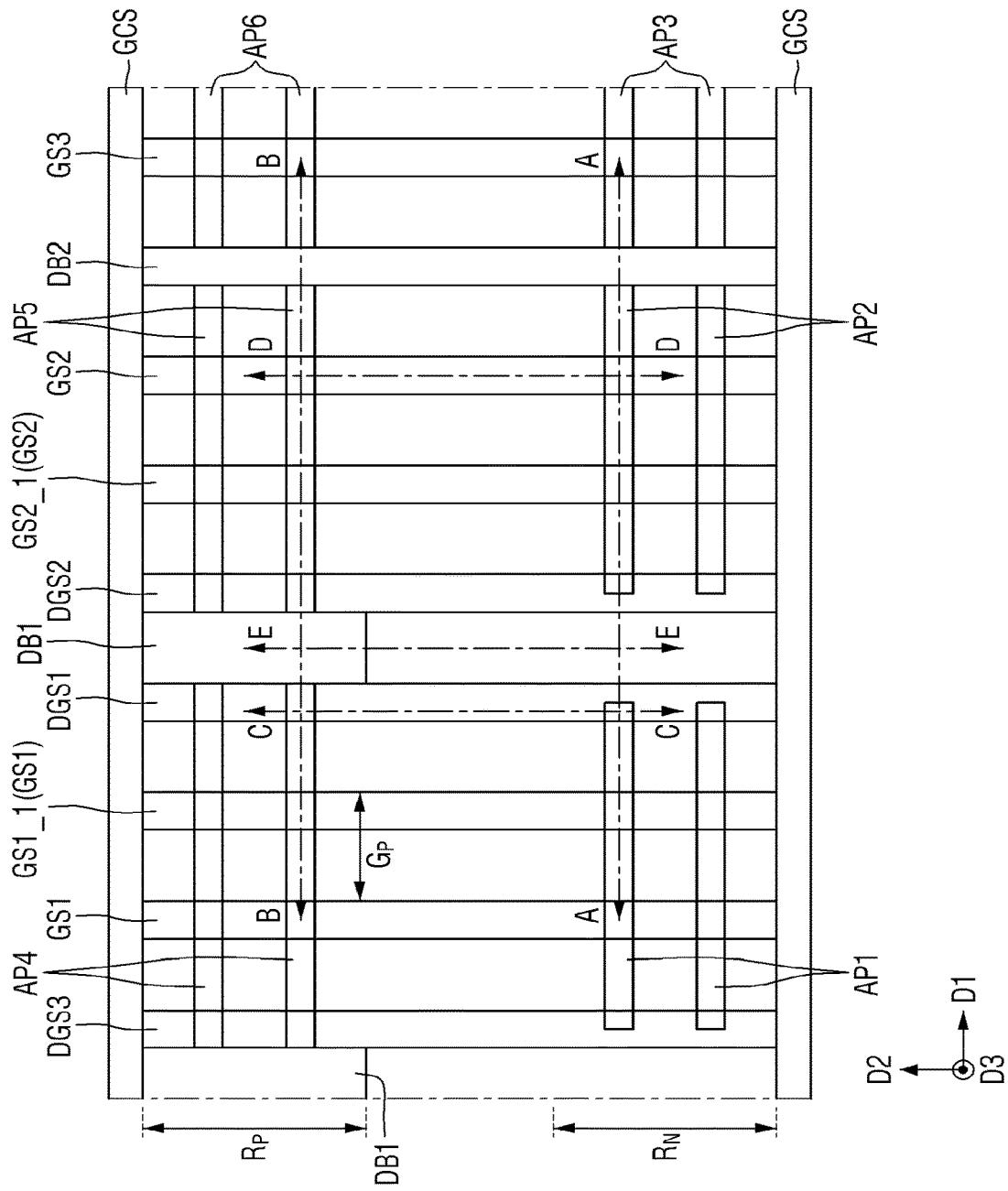
FIGS. 1 to 6 illustrate a semiconductor device according to some embodiments of the present disclosure.

In the drawings of a semiconductor device according to some embodiments, although a fin-type transistor (FinFET) including a channel region having a fin type pattern shape, and a transistor including a nanowire or a nanosheet are shown, the present disclosure is not limited thereto. The technical idea of the present disclosure may be applied to two-dimensional material-based transistors (2D material based FETs) and a heterostructure thereof.

In addition, the semiconductor device according to some embodiments may include a tunneling transistor (tunneling FET) or a three-dimensional (3D) transistor. The semiconductor device according to some embodiments may also include a bipolar junction transistor, a lateral double diffusion transistor (LDMOS), and the like.

FIGS. 1 to 6 illustrate a semiconductor device according to some embodiments of the present disclosure.

Figure 2:
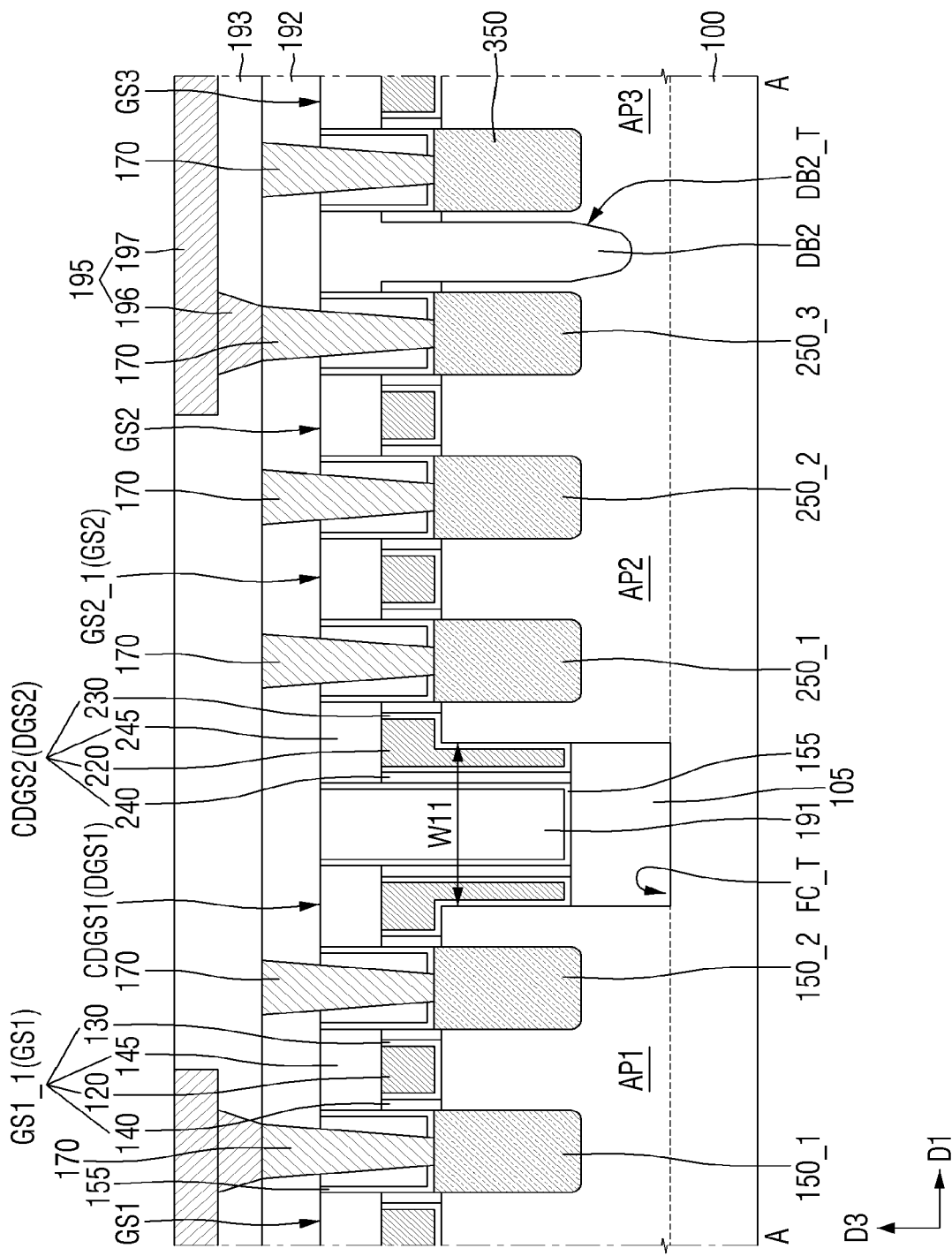
Figure 3:
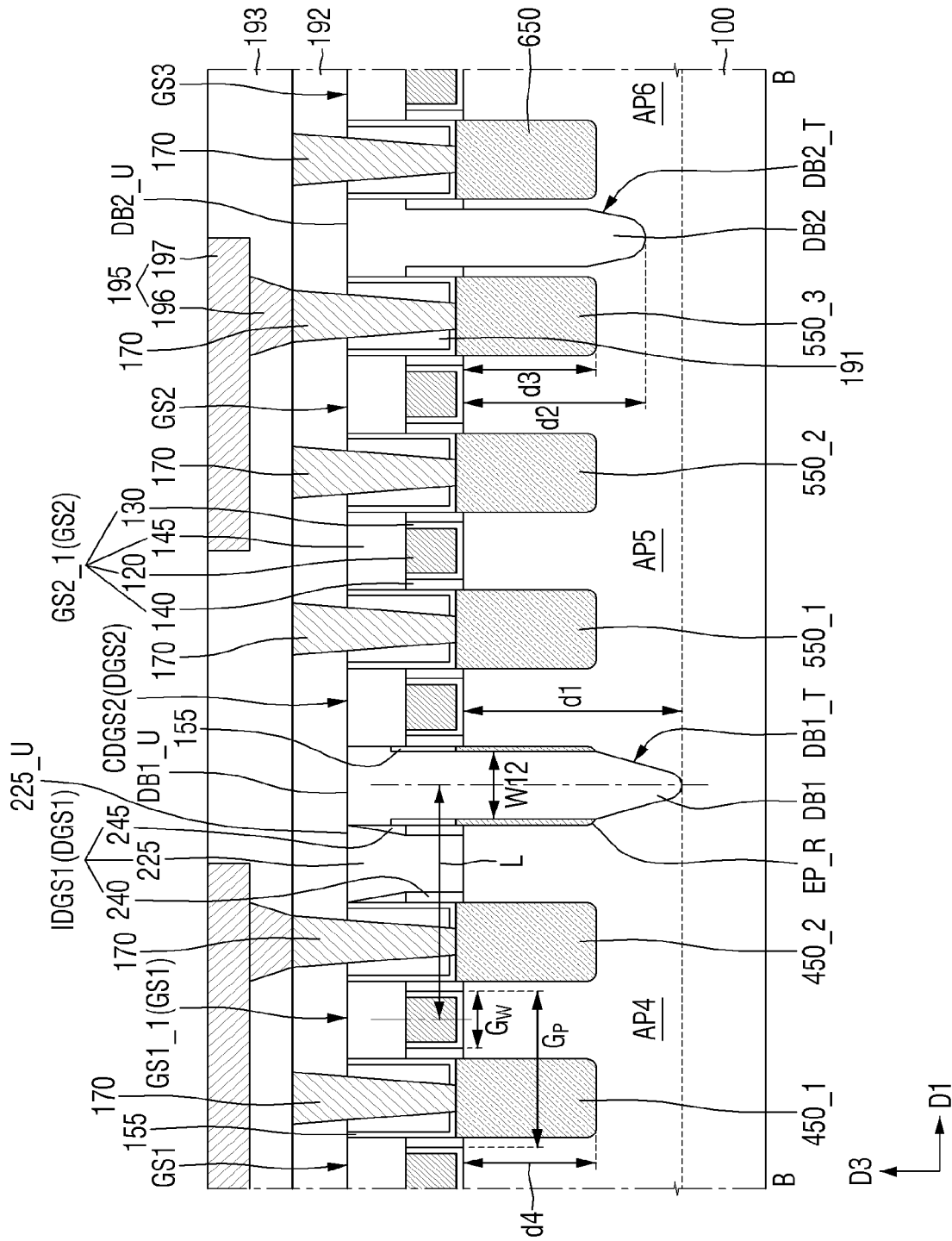
Figure 4A:
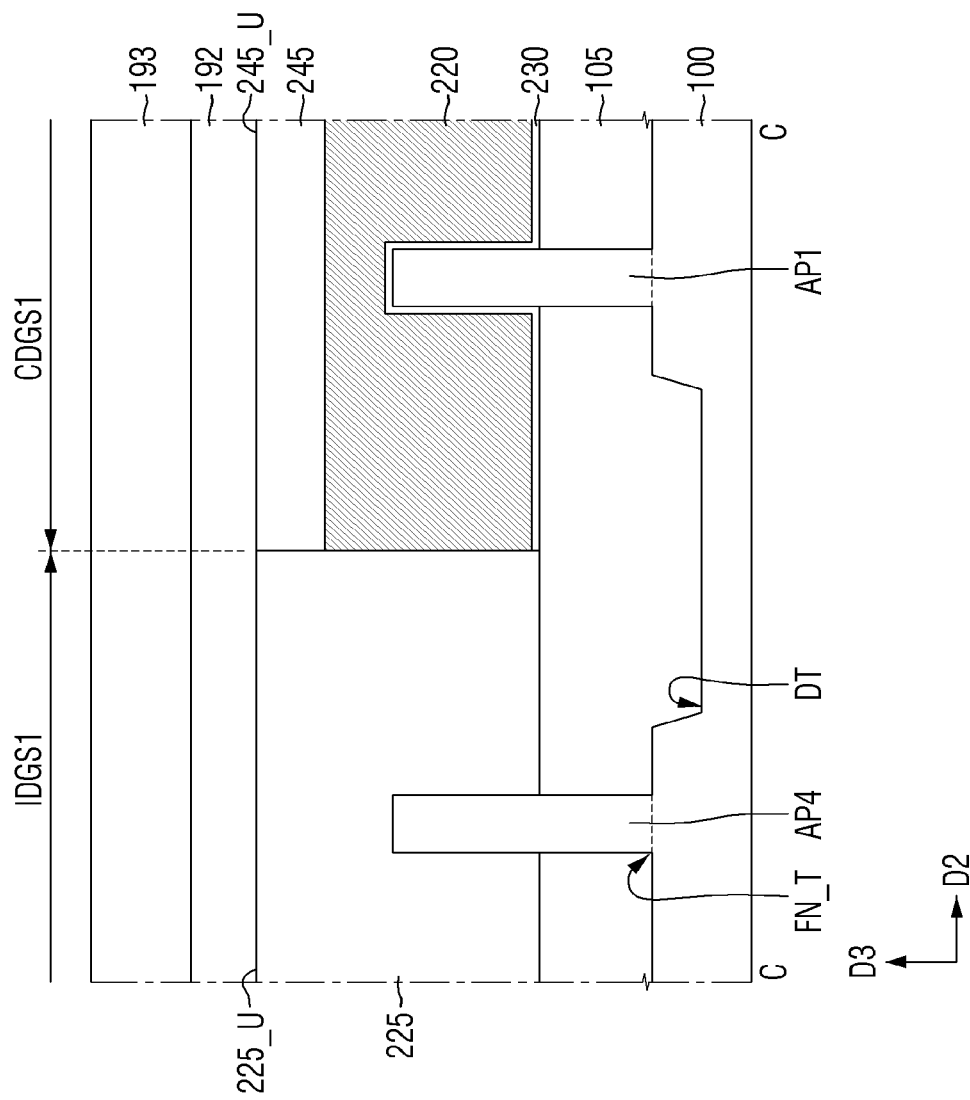
Figure 5:
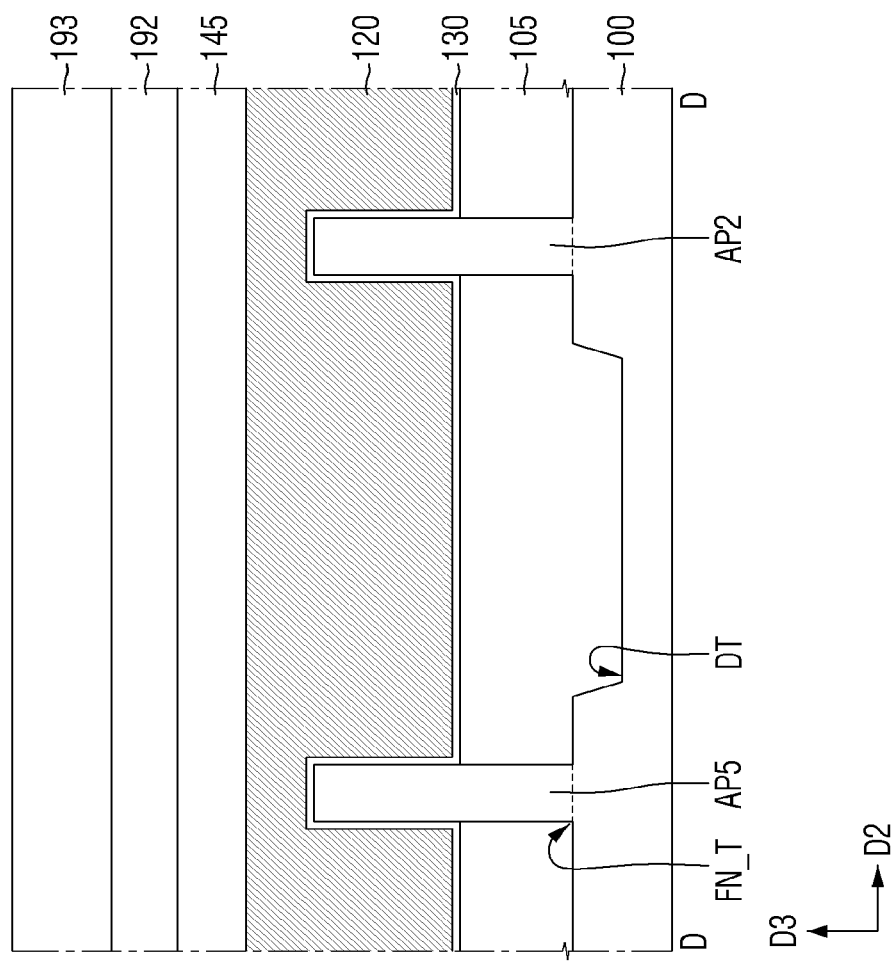
Figure 6:
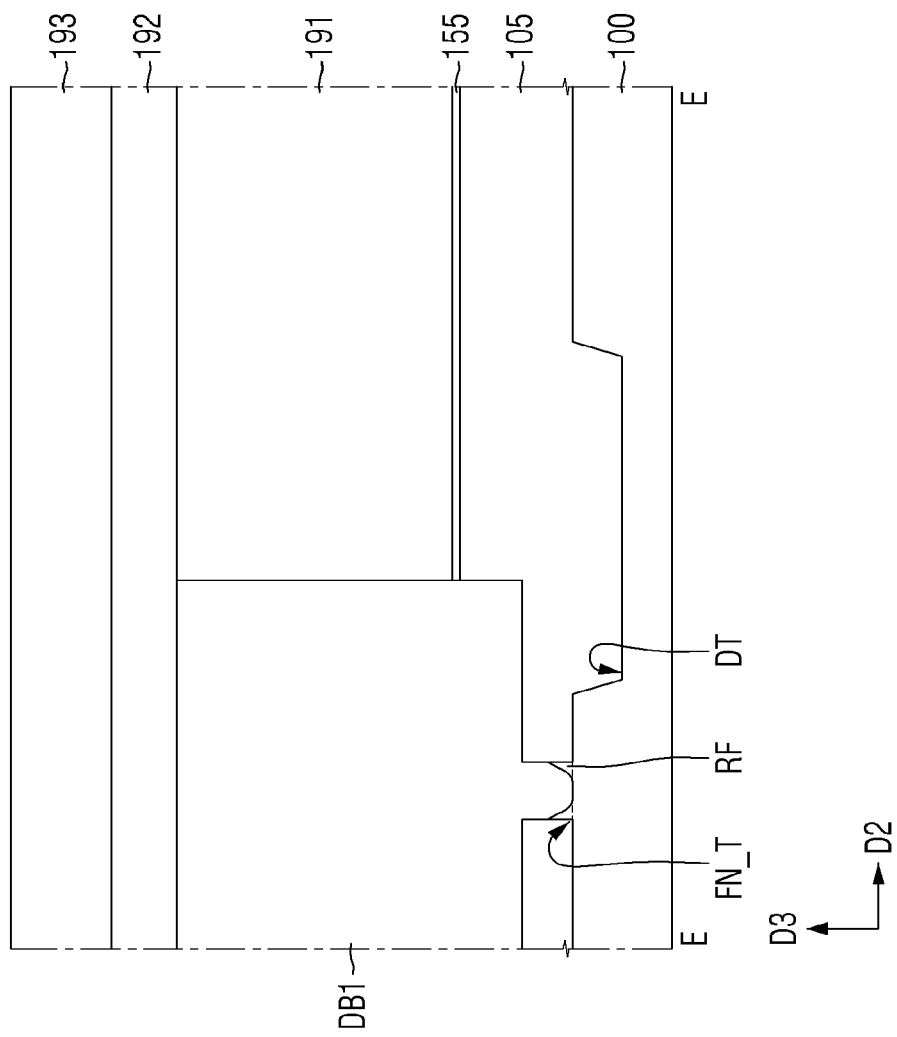

FIG. 1 is an exemplary layout diagram of the semiconductor device according to some embodiments. FIGS. 2 and 3 are cross-sectional views taken along lines A-A and B-B of FIG. 1. FIGS. 4A and 4B are cross-sectional views taken along a line C-C of FIG. 1. FIGS. 5 and 6 are cross-sectional views taken along lines D-D and E-E of FIG. 1. For convenience of explanation, interlayer insulation films 191, 192 and 193, a source/drain contact 170, and a wiring structure 195 are not shown in FIG. 1. For reference, FIG. 4A is a case where a first active pattern AP1 is included in the cross-sectional view, and FIG. 4B is a case where the first active pattern AP1 is not included in the cross-sectional view.

Referring to FIGS. 1 to 6, the semiconductor device according to some embodiments may include first to sixth active patterns AP1 to AP6, first to third normal gate structures GS1 to GS3, first to third dummy gate structures DGS1 to DGS3, and a first element separation structure DB1.

The substrate 100 may include a first active region $R_N$, a second active region $R_P$, and a field region between the first active region $R_N$ and the second active region $R_P$. The field region may form a boundary with the first active region $R_N$ and the second active region $R_P$. The first active region $R_N$ and the second active region $R_P$ are spaced apart from each other. The first active region $R_N$ and the second active region $R_P$ may be separated by the field region.

In an implementation, an element separation film may surround the peripheries of the first active region $R_N$ and the second active region $R_P$ that are spaced apart from each other. A portion of the element separation film between the first active region $R_N$ and the second active region $R_P$ may be defined as a field region. For example, a portion in which a channel region of a transistor, which may be an example of a semiconductor device, is formed may be an active region, and a portion that divides the channel region of the transistor in the active region may be a field region. Alternatively, the active region is a portion in which the fin type pattern or nanosheet used as the channel region of the transistor is formed, and the field region may be a region in which the fin type pattern or nanosheet used as the channel region is not formed.

As shown in FIGS. 4A to 5, the field region may be defined by, e.g., a deep trench DT.

In the semiconductor device according to some embodiments, the first active region $R_N$ may be a region in or on which the NMOS is formed, and the second active region $R_P$ may be a region in or on which the PMOS is formed.

The substrate 100 may be a silicon substrate or SOI (silicon-on-insulator). In an implementation, the substrate 100 may include, e.g., silicon germanium, SGOI (silicon germanium on insulator), indium antimonide, lead telluride, indium arsenide, indium phosphide, gallium arsenide, or gallium antimonide. As used herein, the term "or" is not an exclusive term, e.g., "A or B" would include A, B, or A and B.

The first to third active patterns AP1 to AP3 may be in the first active region $R_N$. Each of the first to third active patterns AP1 to AP3 may protrude from the first active region $R_N$ of the substrate 100. Each of the first to third active patterns AP1 to AP3 may extend (e.g., lengthwise) in a first direction D1. The first to third active patterns AP1 to AP3 may be spaced apart from each other in the first direction D1 and arranged in the first direction D1.

The first active pattern AP1 and the second active pattern AP2 may be separated by a fin-cut trench FC_T. The fin-cut trench FC_T may define a short side of the first active pattern AP1 and a short side of the second active pattern AP2.

The second active pattern AP2 and the third active pattern AP3 may be separated by a second element separation trench DB2_T. The second element separation trench DB2_T may separate at least some of the second active pattern AP2 and the third active pattern AP3. In an implementation, the second element separation trench DB2_T may not completely separate the second active pattern AP2 and the third active pattern AP3. In an implementation, the second element separation trench DB2_T may completely separate the second active pattern AP2 and the third active pattern AP3.

The fourth to sixth active patterns AP4 to AP6 may be in the second active region $R_P$. Each of the fourth to sixth active patterns AP4 to AP6 may protrude from the second active region $R_P$ of the substrate 100. Each of the fourth to sixth active patterns AP4 to AP6 may extend (e.g., lengthwise) in the first direction D1. The fourth to sixth active patterns AP4 to AP6 may be spaced apart from each other in the first direction D1 and arranged in the first direction D1.

The fourth active pattern AP4 and the fifth active pattern AP5 may be separated by a first element separation trench DB1_T. The first element separation trench DB1_T may separate at least some of the fourth active pattern AP4 and the fifth active pattern AP5.

The fifth active pattern AP5 and a sixth active pattern AP6 may be separated by a second element separation trench DB2_T. The second element separation trench DB2_T may separate at least some of the fifth active pattern AP5 and the sixth active pattern AP6.

A depth of a lowermost part of the first element separation trench DB1_T may be deeper than a depth of a lowermost part of the second element separation trench DB2_T. In an implementation, a depth d1 of the lowermost part of the first element separation trench DB1_T may be deeper than a depth d2 of the lowermost part of the second element separation trench DB2_T, on the basis of or when measured from an upper surface of the fifth active pattern AP5 (e.g., in a third direction D3).

In an implementation, a width W11 of the fin-cut trench FC_T in the first direction D1 measured at the upper surface of the first active pattern AP1 may be greater than a width W12 of the first element separation trench DB1_T in the first direction D1 measured at the upper surface of the fourth active pattern AP4. The upper surface of the first active pattern AP1 may be located at substantially the same height level as (e.g., coplanar with or a same distance from the substrate 100 in the third direction D3 as) the upper surface of the fourth active pattern AP4.

Long sides of each of the first to sixth active patterns AP1 to AP6 may be defined by a fin trench FN_T. The long sides of each of the first to sixth active patterns AP1 to AP6 mean a side extending in the first direction D1.

In an implementation, the first to sixth active patterns AP1 to AP6 may be multi-channel active patterns. In the semiconductor device according to some embodiments, each of the first to sixth active patterns AP1 to AP6 may be, e.g., a fin type pattern. Each of the first to sixth active patterns AP1 to AP6 may be a channel pattern of a transistor. In an implementation, two of the first to sixth active patterns AP1 to AP6 may be included. In an implementation, the first to sixth active patterns AP1 to AP6 may be included in a number of one or more.

Each of the first to sixth active patterns AP1 to AP6 may be a part of the substrate 100, and may include an epitaxial layer grown from the substrate 100. Each of the first to sixth active patterns AP1 to AP6 may include, e.g., silicon or germanium which is an elemental semiconductor material. In an implementation, each of the first to sixth active patterns AP1 to AP6 may include a compound semiconductor, e.g., a group IV-IV compound semiconductor or a group III-V compound semiconductor.

The group IV-IV compound semiconductor may be, e.g., binary compounds or ternary compounds containing at least two of carbon (C), silicon (Si), germanium (Ge), and tin (Sn) or a compound obtained by doping these elements with the group IV element.

The group III-V compound semiconductor may be, e.g., one of a binary compound, a ternary compound or a quaternary compound formed by combining at least one of aluminum (Al), gallium (Ga) and indium (In) as a group III element with one of phosphorus (P), arsenic (As) and antimony (Sb) as a group V element.

In an implementation, the first to sixth active patterns AP1 to AP6 may include the same material. In an implementation, the first to third active patterns AP1 to AP3 (in the first active region $R_N$) may include materials different from those of the fourth to sixth active patterns AP4 (in the second active region $R_P$).

A field insulation film 105 may be on the substrate 100. The field insulation film 105 may fill at least some parts of the fin-cut trench FC_T and the fin trench FN_T. The field insulation film 105 may fill the deep trench DT.

The field insulation film 105 may be on a part of the sidewalls of the first to sixth active patterns AP1 to AP6. The first to sixth active patterns AP1 to AP6 may protrude upwardly from or above the upper surfaces of each field insulation film 105. The field insulation film 105 may include, e.g., an oxide film, a nitride film, an oxynitride film, or a combination film thereof. In an implementation, the field insulation film 105 may fill a part of the fin-cut trench FC_T.

Each of the gate structures GS1, GS2, GS3, DGS1, DGS2, and DGS3 may extend (e.g., lengthwise) in the second direction D2. The gate structure may include normal gate structures GS1, GS2 and GS3 and dummy gate structures DGS1, DGS2 and DGS3. In illustrated in FIG. 1, a number of each of the first to third normal gate structures GS1, GS2 and GS3 is merely for convenience of explanation.

In an implementation, the dummy gate structures DGS1, DGS2 and DGS3 may be at the ends of the first to sixth active patterns AP1 to AP6. Accordingly, at a point on which the dummy gate structures DGS1, DGS2, and DGS3 intersect the first to sixth active patterns AP1 to AP6, a source/drain pattern may not be on one side or both sides of the dummy gate structures DGS1, DGS2 and DGS3. The source/drain pattern may be on or at both sides of the normal gate structures GS1, GS2 and GS3.

In an implementation, each of the gate structures GS1, GS2, GS3, DGS1, DGS2 and DGS3 may be on the first active region $R_N$ and the second active region $R_P$. In an implementation, at least one of the normal gate structures GS1, GS2, GS3 may be divided into two parts and may be on the first active region $R_N$ and the second active region $R_P$.

Each of the gate structures GS1, GS2, GS3, DGS1, DGS2 and DGS3 may be between the gate cutting structures GCS (extending in the first direction D1). Each of the gate structures GS1, GS2, GS3, DGS1, DGS2 and DGS3 may be connected to the gate cutting structure GCS.

A first dummy gate structure DGS1 and a third dummy gate structure DGS3 may be on the first active pattern AP1 and the fourth active pattern AP4, respectively. The first dummy gate structure DGS1 and the third dummy gate structure DGS3 may intersect the first active pattern AP1 and the fourth active pattern AP4, respectively.

Each of the first dummy gate structure DGS1 and the third dummy gate structure DGS3 may overlap an end of the first active pattern AP1 including a short side of the first active pattern AP1, and an end of the fourth active pattern AP4 including a short side of the fourth active pattern AP4.

In an implementation, each of the first dummy gate structure DGS1 and the third dummy gate structure DGS3 may wrap the end of the first active pattern AP1. A part of the first dummy gate structure DGS1 and a part of the third dummy gate structure DGS3 may extend along or cover the upper surface of the first active pattern AP1. The first dummy gate structure DGS1 and the third dummy gate structure DGS3 may not wrap the end of the fourth active pattern AP4.

A second dummy gate structure DGS2 may be on the second active pattern AP2 and the fifth active pattern AP5. The second dummy gate structure DGS2 may intersect the second active pattern AP2 and the fifth active pattern AP5.

The second dummy gate structure DGS2 may overlap an end of the second active pattern AP2 including a short side of the second active pattern AP2, and an end of the fifth active pattern AP5 including a short side of the fifth active pattern AP5.

In an implementation, the second dummy gate structure DGS2 may cover (e.g., may wrap) the end of the second active pattern AP2. A part of the second dummy gate structure DGS2 may extend along or cover the upper surface of the second active pattern AP2. The second dummy gate structure DGS2 may not wrap the end of the fifth active pattern AP5.

The first element separation trench DB1_T separating the fourth active pattern AP4 and the fifth active pattern AP5 may be between the first dummy gate structure DGS1 and the second dummy gate structure DGS2.

In an implementation, the first dummy gate structure DGS1 may include a first conductive dummy structure CDGS1 and a first insulating dummy structure IDGS1. The second dummy gate structure DGS2 may include a second conductive dummy structure CDGS2, and may not include an insulating dummy structure.

The first conductive dummy structure CDGS1 may intersect the first active pattern AP1 and may not intersect the fourth active pattern AP4. The first insulating dummy structure IDGS1 may intersect the fourth active pattern AP4 and may not intersect the first active pattern AP1. The first conductive dummy structure CDGS1 may be in contact with the first insulating dummy structure IDGS1.

The second conductive dummy structure CDGS2 may intersect the second active pattern AP2 and the fifth active pattern AP5.

The first conductive dummy structure CDGS1 and the second conductive dummy structure CDGS2 may include, e.g., a dummy conductive gate 220, a dummy gate insulation film 230, a dummy gate spacer 240, and a dummy gate capping pattern 245.

The first insulating dummy structure IDGS1 may include, e.g., a dummy insulation gate 225, a dummy gate spacer 240, and a dummy gate capping pattern 245. The dummy insulation gate 225 may be between the dummy gate spacer 240 and the dummy gate capping pattern 245. In an implementation, the first insulating dummy structure IDGS1 may not include at least one of the dummy gate spacer 240 and the dummy gate capping pattern 245.

The dummy insulation gate 225 of the first insulating dummy structure IDGS1 may intersect the fourth active pattern AP4 and may not intersect the first active pattern AP1. The dummy insulation gate 225 of the first insulating dummy structure IDGS1 may cover the fourth active pattern AP4 protruding upward from the upper surface of the field insulation film 105. In an implementation, the dummy insulation gate 225 of the first insulating dummy structure IDGS1 may be in contact (e.g., direct contact) with the fourth active pattern AP4. The dummy insulation gate 225 of the first insulating dummy structure IDGS1 may be in contact with the sidewall of the fourth active pattern AP4 protruding upward from the upper surface of the field insulation film 105.

The dummy conductive gate 220 of the first conductive dummy structure CDGS1 may intersect the first active pattern AP1 and may not intersect the fourth active pattern AP4. The dummy insulation gate 225 of the first insulating dummy structure IDGS1 may be in contact with the dummy conductive gate 220 of the first conductive dummy structure CDGS1. The dummy conductive gate 220 of the second conductive dummy structure CDGS2 may intersect the second active pattern AP2 and the fifth active pattern AP5.

The dummy insulation gate 225 may include, e.g., silicon nitride, silicon oxide, silicon carbide, silicon carbonitride, silicon oxycarbide, silicon oxynitride, silicone oxycarbonitride, or aluminum oxide.

The normal gate structures GS1, GS2 and GS3 may include, e.g., a normal conductive gate 120, a normal gate insulation film 130, a normal gate spacer 140, and a normal gate capping pattern 145.

The first normal gate structure GS1 may be on the first active pattern AP1 and the fourth active pattern AP4 and may intersect the first active pattern AP1 and the fourth active pattern AP4. At least one first normal gate structure GS1 may be on the first active pattern AP1 and the fourth active pattern AP4. The first normal gate structure GS1 may be between the first dummy gate structure DGS1 and the third dummy gate structure DGS3. The first normal gate structure GS1 may include one (e.g., a first_1) normal gate structure GS1_1 that is closest to the first dummy gate structure DGS1.

The second normal gate structure GS2 may be on the second active pattern AP2 and the fifth active pattern AP5 and may intersect the second active pattern AP2 and the fifth active pattern AP5. At least one second normal gate structure GS2 may be on the second active pattern AP2 and the fifth active pattern AP5. The second normal gate structure GS2 may include on (e.g., a second_1) normal gate structure GS2_1 that is closest to the second dummy gate structure DGS2.

The third normal gate structure GS3 may be on the third active pattern AP3 and the sixth active pattern AP6 and may intersect the third active pattern AP3 and the sixth active pattern AP6. At least one third normal gate structure GS3 may be on the third active pattern AP3 and the sixth active pattern AP6.

In an implementation, as illustrated in FIG. 5, the normal gate insulation film 130 of the second normal gate structure GS2 may extend along profiles of the second active pattern AP2 and the fifth active pattern AP5 protruding upward from the upper surface of the field insulation film 105. The normal conductive gate 120 may be on the normal gate insulation film 130. The first and third normal gate structures GS1 and GS3 may also have shapes similar to that of the second normal gate structure GS2.

The normal conductive gate 120 and the normal gate insulation film 130 may be between the normal gate spacers 140. The normal gate capping pattern 145 may be on the normal conductive gate 120 and the normal gate insulation film 130. In an implementation, as illustrated in the drawings, the normal gate capping pattern 145 may cover the upper surface of the normal gate spacer 140. In an implementation, the normal gate capping pattern 145 may be placed between the normal gate spacers 140.

Adjacent first normal gate structures GS1 may be spaced apart from each other by a gate pitch $G_P$. In an implementation, when the normal gate insulation film 130 and the normal conductive gate 120 between the normal gate spacers 140 are set as normal gate patterns, the normal gate patterns may have a gate width $G_W$ in the first direction D1. When the normal gate patterns include one sidewall and the other sidewall facing each other in the first direction D1, the gate pitch may be a distance between one sidewalls of adjacent normal gate patterns. The normal gate pattern may face the normal gate spacer 140, and one sidewall of the normal gate pattern may be a boundary between the normal gate insulation film 130 and the normal gate spacer 140. In an implementation, the gate pitch $G_P$ may be a distance between width centers of adjacent normal conductive gates 120.

Adjacent second normal gate structures GS2 may also be spaced apart from each other by the gate pitch $G_P$, and third normal gate structures GS3 may also be spaced apart from each other by the gate pitch $G_P$.

Explanation of the first conductive dummy structure CDGS1 and the second conductive dummy structure CDGS2 may be similar to explanation of the normal gate structures GS1, GS2 and GS3.

The normal conductive gate 120 and the dummy conductive gate 220 may be conductive gates including a conductive material. At least one conductive gate may be on the respective first to sixth active patterns AP1 to AP6. In an implementation, one dummy conductive gate 220 and two normal conductive gates 120 may be on the fifth active pattern AP5, and three dummy conductive gates AP5 may be on the fifth active pattern AP5.

The normal conductive gate 120 and the dummy conductive gate 220 may include the same material. The normal conductive gate 120 and the dummy conductive gate 220 may include, e.g., titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), or combinations thereof. When the normal conductive gate 120 and the dummy conductive gate 220 include a plurality of stacked conductive films, the normal conductive gate 120 and the dummy conductive gate 220 may have the same stacked film structure.

The normal gate insulation film 130 and the dummy gate insulation film 230 may include the same material. The normal gate insulation film 130 and the dummy gate insulation film 230 may include silicon oxide, silicon oxynitride, silicon nitride, or a high-dielectric constant material having a higher dielectric constant than silicon oxide. The high-dielectric constant material may include, e.g., boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

The normal gate spacer 140 and the dummy gate spacer 240 may include the same material. The normal gate spacer 140 and the dummy gate spacer 240 may include, e.g., silicon nitride (SiN), silicon oxynitride (SiON), silicon oxide ($SiO_2$), silicon oxycarbonitride (SiOCN), silicon boron nitride (SiBN), silicon oxyboron nitride (SiOBN), silicon oxycarbide (SiOC), or combinations thereof.

The normal gate capping pattern 145 and the dummy gate capping pattern 245 may include, e.g., silicon nitride (SiN), silicon oxynitride (SiON), silicon oxide ($SiO_2$), silicon carbonitride (SiCN), and silicon oxycarbonitride (SiOCN), or combinations thereof.

In an implementation, the normal gate capping pattern 145 and the dummy gate capping pattern 245 may not be on the normal conductive gate 120 and the dummy conductive gate 220. In such a case, some of the upper surfaces (e.g., 245_U of FIG. 4A) of the gate structures GS1, GS2, GS3, DGS1, DGS2 and DGS3 may be defined by the normal conductive gate 120 and the dummy conductive gate 220.

First source/drain patterns 150_1 and 150_2 may be placed on the first active pattern AP1. The first source/drain patterns 150_1 and 150_2 may be on both sides of the normal conductive gate 120 of the first normal gate structure GS1. One first source/drain pattern 150_2 may be on the first active pattern AP1 between the first normal gate structure GS1 and the first dummy gate structure DGS1.

Second source/drain patterns 250_1, 250_2 and 250_3 may be on the second active pattern AP2. The second source/drain patterns 250_1, 250_2 and 250_3 may be on both sides of the normal conductive gate 120 of the second normal gate structure GS2. One second source/drain pattern 250_1 may be on the second active pattern AP2 between the second normal gate structure GS2 and the second dummy gate structure DGS2.

A third source/drain pattern 350 may be on the third active pattern AP3. The third source/drain pattern 350 may be on both sides of the normal conductive gate 120 of the third normal gate structure GS3.

Fourth source/drain patterns 450_1 and 450_2 may be on the fourth active pattern AP4. The fourth source/drain patterns 450_1 and 450_2 may be on both sides of the normal conductive gate 120 of the first normal gate structure GS1. One fourth source/drain pattern 450_2 may be on the fourth active pattern AP4 between the first normal gate structure GS1 and the first dummy gate structure DGS1.

Fifth source/drain patterns 550_1, 550_2 and 550_3 may be on the fifth active pattern AP5. The fifth source/drain patterns 550_1, 550_2 and 550_3 may be on both sides of the normal conductive gate 120 of the second normal gate structure GS2. One fifth source/drain pattern 550_1 may be on the fifth active pattern AP5 between the second normal gate structure GS2 and the second dummy gate structure DGS2.

A sixth source/drain pattern 650 may be on the sixth active pattern AP6. The sixth source/drain pattern 650 may be on both sides of the normal conductive gate 120 of the third normal gate structure GS3.

The first to sixth source/drain patterns 150_1, 150_2, 250_1, 250_2, 250_3, 350, 450_1, 450_2, 550_1, 550_2, 550_3 and 650 may include an epitaxial pattern including a semiconductor material that is grown through an epitaxial process.

An etching stop film 155 may extend along the upper surfaces of the first to sixth source/drain patterns 150_1, 150_2, 250_1, 250_2, 250_3, 350, 450_1, 450_2, 550_1, 550_2, 550_3 and 650. The etching stop film 155 may extend along sidewalls of the gate structures GS1, GS2, GS3, DGS1, DGS2 and DGS3. The etching stop film 155 may extend along the upper surface of the field insulation film 105. The etching stop film 155 may include, e.g., silicon nitride (SiN), silicon oxynitride (SiON), silicon oxycarbide (SiOC), silicon oxycarbonitride (SiOCN), or combinations thereof.

A first interlayer insulation film 191 may be on the etching stop film 155. An upper surface of the first interlayer insulation film 191 may be on the same plane as the upper surfaces (e.g., 245_U of FIG. 4A) of the gate structures GS1 to GS3 and DGS1 to DGS3. The first interlayer insulation film 191 may include, e.g., silicon oxide, silicon nitride, silicon oxynitride, or a low-dielectric constant material. The low-dielectric constant material may include, e.g., Fluorinated TetraEthylOrthoSilicate (FTEOS), Hydrogen Silses-Quioxane (HSQ), Bis-benzoCycloButene (BCB), TetraMethylOrthoSilicate (TMOS), OctaMethyleyCloTetraSiloxane (OMCTS), HexaMethylDiSiloxane (HMDS), TriMethylSilyl Borate (TMSB), DiAcetoxyDitertiaryButoSiloxane (DADBS), TriMethylSilil Phosphate (TMSP), PolyTetraFluoroEthylene (PTFE), TOSZ (Tonen SilaZen), FSG (Fluoride Silicate Glass), polyimide nanofoams such as polypropylene oxide, CDO (Carbon Doped silicon Oxide), OSG (Organo Silicate Glass), SiLK, Amorphous Fluorinated Carbon, silica aerogels, silica xerogels, mesoporous silica, or combinations thereof.

A first element separation structure DB1 may be between the first dummy gate structure DGS1 and the second dummy gate structure DGS2. The fourth active pattern AP4 and the fifth active pattern AP5 may be separated by the first element separation structure DB1. The first element separation structure DB1 may separate at least a part of the fourth active pattern AP4 and the fifth active pattern AP5.

In an implementation, the first element separation structure DB1 may not overlap the first active pattern AP1 and the second active pattern AP2 in the second direction D2.

The fourth source/drain patterns 450_1 and 450_2 may not be between the first element separation structure DB1 and the first dummy gate structure DGS1. The fifth source/drain patterns 550_1, 550_2 and 550_3 may not be between the first element separation structure DB1 and the second dummy gate structure DGS2.

The first_1 normal gate structure GS1_1 may include a normal conductive gate that is closest to the first element separation structure DB1. One fourth source/drain pattern 450_2 and dummy insulation gate 225 may be between the first element separation structure DB1 and the first_1 normal gate structure GS1_1, and a spaced distance L between a width center of the normal conductive gate 120 of the first_1 normal gate structure GS1_1 and a width center of the first element separation structure DB1 in the first direction D1 may be greater than the gate pitch $G_P$.

The dummy insulation gate 225 of the first insulating dummy structure IDGS1 may be between the normal conductive gate 120 of the first_1 normal gate structure GS1_1 and the first element separation structure DB1. Referring to the fabricating process, the dummy insulation gate 225 may be formed at a position from which the dummy conductive gate 220 and the dummy gate insulation film 230 are removed, and a spaced distance between the fourth source/drain pattern 450_2, which is closest to the first element separation structure DB1, and the first element separation structure DB1 in the first direction D1 may be greater than the gate width $G_W$, as measured at the upper surface of the fourth active pattern AP4.

The first element separation structure DB1 may be in the first element separation trench DB1_T. The first element separation structure DB1 may fill the first element separation trench DB1_T.

A part of the source/drain pattern EP_R may be along a part of the sidewall of the first element separation structure DB1. In an implementation, a part of the source/drain pattern EP_R may not be on the sidewall of the first element separation structure DB1. An etching stop film 155 may be along a part of the sidewall of the first element separation structure DB1. In an implementation, the etching stop film 155 may not be on the sidewall of the first element separation structure DB1.

In an implementation, a height of an upper surface DB1_U of the first element separation structure may be higher than a height of the upper surface of the normal conductive gate 120 on the basis of the upper surface of the fourth active pattern AP4. In an implementation, if the normal gate structure does not include the normal gate capping pattern 145, the height of the upper surface DB1_U of the first element separation structure may be the same as the height of the upper surface of the normal conductive gate 120, measured from the upper surface of the fourth active pattern AP4.

Measured from the upper surface of the fifth active pattern AP5, a depth d4 to lowermost parts of the fourth source/drain patterns 450_1 and 450_2 may be shallower than a depth d1 to a lowermost part of the first element separation structure DB1.

As illustrated in FIG. 5, a part of the field insulation film 105 below the first element separation structure DB1 may be recessed. A bottom surface of the first element separation structure DB1 may be defined by the field insulation film 105, the substrate 100, and the remaining fin RF. The remaining fin RF may be a portion that is left after an active pattern portion is removed in an etching process for forming the first element separation trench (DB1_T of FIG. 3). In an implementation, there may be no remaining fin RF.

The second element separation structure DB2 may separate at least a part of the second active pattern AP2 and the third active pattern AP3, and may separate at least a part of the fifth active pattern AP5 and the sixth active pattern AP6.

The second element separation structure DB2 may be between a fifth source/drain pattern 550_3 and a sixth source/drain pattern 650 which are closest to each other. The normal conductive gate 120 of the second normal gate structure GS2 may not be between the second element separation structure DB2 and the fifth source/drain pattern 550_3. The normal conductive gate 120 of the third normal gate structure GS3 may not be between the second element separation structure DB2 and the sixth source/drain pattern 650.

The second element separation structure DB2 may be in the second element separation trench DB2_T. The second element separation structure DB2 may fill the second element separation trench DB2_T. The second element separation structure DB2 may extend in the second direction D2.

In an implementation, the second element separation structure DB2 may separate the active region in one of the first active region $R_N$ and the second active region $R_P$. In an implementation, the second element separation structure DB2 may separate the fifth active pattern AP5 and the sixth active pattern AP6 of the second active region $R_P$, and may not separate the active pattern of the first active region $R_N$. In such a case, the second active pattern AP2 and the third active pattern AP3 may be a single active pattern that is not separated.

In an implementation, a height of an upper surface DB2_U of the second element separation structure DB2 may be higher than a height of the upper surface of the normal conductive gate 120 measured from the upper surface of the fifth active pattern AP5. In an implementation, if the normal gate structure does not include the normal gate capping pattern 145, the height of the upper surface DB2_U of the second element separation structure may be the same as the height of the upper surface of the normal conductive gate 120 measured from the upper surface of the fifth active pattern AP5.

Measured from the upper surface of the fifth active pattern AP5 (e.g., in the third direction D3), a depth d2 to the lowermost part of the second element separation structure DB2 may be deeper than a depth d3 to the lowermost part of the fifth source/drain pattern 550_3.

In an implementation, measured from the upper surface of the fifth active pattern AP5, the depth d2 to the lowermost part of the second element separation structure DB2 may be shallower than the depth d1 to the lowermost part of the first element separation structure DB1. Even if the first element separation trench DB1_T for the first element separation structure DB1 is deeply formed, it may not affect the peripheral source/drain pattern. On the other hand, if the second element separation trench DB2_T for the second element separation structure DB2 were to be deeply formed, the second element separation trench DB2_T may etch a part of the peripheral source/drain pattern. Therefore, the first element separation trench DB1_T may be formed to be deeper than the second element separation trench DB2_T.

Each of the first element separation structure DB1 and the second element separation structure DB2 may include, e.g., silicon nitride, silicon oxide, silicon carbide, silicon carbonitride, silicon oxycarbide, silicon oxynitride, silicon oxycarbonitride, aluminum oxide. In an implementation, each of the first element separation structure DB1 and the second element separation structure DB2 may be a single film. In an implementation, at least one of the first element separation structure DB1 and the second element separation structure DB2 may be formed of a plurality of films.

In an implementation, the upper surface DB1_U of the first element separation structure, the upper surface DB2_U of the second element separation structure and the upper surface 225_U of the dummy insulation gate may be on the same plane as the upper surfaces of the gate structures GS1 to GS3 and DGS1 to DGS3. In an implementation, at least one of the upper surface DB1_U of the first element separation structure, the upper surface DB2_U of the second element separation structure and the upper surface 225_U of the dummy insulation gate may be higher than the upper surfaces of the gate structures GS1 to GS3 and DGS1 to DGS3. Further, according to the fabricating procedure of the first element separation structure DB1, the second element separation structure DB2 and the dummy insulation gate 225, the upper surface DB1_U of the first element separation structure, the upper surface DB2_U of the second element separation structure, and the upper surface 225_U of the dummy insulation gate may be located at different heights from each other, measured from the upper surface of the fifth active pattern AP5.

In an implementation, as illustrated in FIGS. 1 to 3, the second active pattern AP2 and the third active pattern AP3 may be separated, and the fifth active pattern AP5 and the sixth active pattern AP6 may be separated by the second element separation structure DB2. In an implementation, the second active pattern AP2 and the third active pattern AP3 may be separated by the fin-cut trench FC_T, and the fifth active pattern AP5 and the sixth active pattern AP6 may be separated by the first element separation structure DB1.

In an implementation, the first conductive dummy structure CDGS1 may intersect the fourth active pattern AP4 and may not intersect the first active pattern AP1. The first insulating dummy structure IDGS1 may intersect the first active pattern AP1 and may not intersect the fourth active pattern AP4.

A second interlayer insulation film 192 may be on the gate structures GS1 to GS3 and DGS1 to DGS3. A third interlayer insulation film 193 may be on the second interlayer insulation film 192. The second interlayer insulation film 192 and the third interlayer insulation film 193 may each include, e.g., silicon oxide, silicon nitride, silicon oxynitride, or a low-dielectric constant material.

The source/drain contact 170 may be connected to the first to sixth source/drain patterns 150_1, 150_2, 250_1, 250_2, 250_3, 350, 450_1, 450_2, 550_1, 550_2, 550_3 and 650. The source/drain contact 170 may be in the second interlayer insulation film 192 and the first interlayer insulation film 191. The source/drain contact 170 may include, e.g., a contact barrier film and a contact filling film.

In an implementation, a silicide film may be further formed between the source/drain contact 170 and the first to sixth source/drain patterns 150_1, 150_2, 250_1, 250_2, 250_3, 350, 450_1, 450_2, 550_1, 550_2, 550_3 and 650.

The source/drain contact 170 may include, e.g., a metal, a metal nitride, a metal carbonitride, a two-dimensional (2D) material, or a conductive semiconductor material.

A wiring structure 195 may be in the third interlayer insulation film 193. The wiring structure 195 may be electrically connected to, e.g., the source/drain contact 170. The wiring structure 195 may include a via 196 and a wiring pattern 197. The wiring structure 195 may include a wiring barrier film and a wiring filling film.

In an implementation, the wiring filling film of the via 196 and the wiring filling film of the wiring pattern 197 may be divided by the wiring barrier film.

The dummy conductive gate 220 included in the dummy gate structures DGS1 to DGS3 may not be used as the gate electrode of the transistor. In an implementation, the dummy conductive gate 220 included in the dummy gate structures DGS1 to DGS3 may be used as a signal line. In an implementation, although some of the dummy conductive gates 220 may be used as signal lines, the rest may not be used as signal lines.

If a portion of the dummy conductive gate 220 that is not used as the signal line were to be located around the source/drain contact 170 connected to the source/drain pattern, the dummy conductive gate 220 may generate parasitic capacitance that is unnecessary for the element operation.

Therefore, the portion of the dummy conductive gate 220 that is not used as the signal line may be replaced with an insulating pattern such as the dummy insulation gate 225. As a result, parasitic capacitance unnecessary for the operation of the element may be be reduced, and the operating performance of the semiconductor device may be improved.

Figure 7:
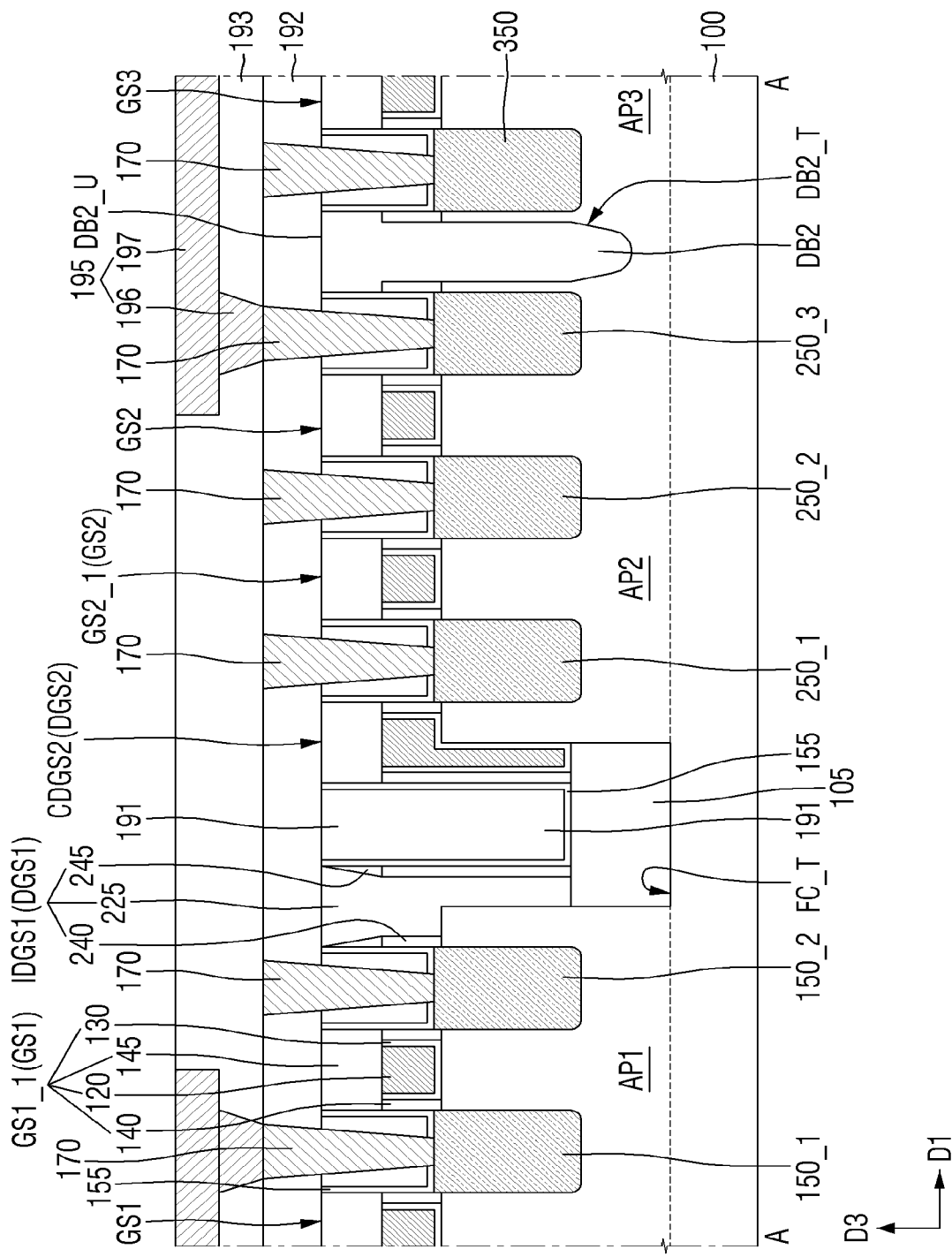
FIGS. 7 and 8 illustrate the semiconductor device according to some embodiments of the present disclosure.
Figure 8:
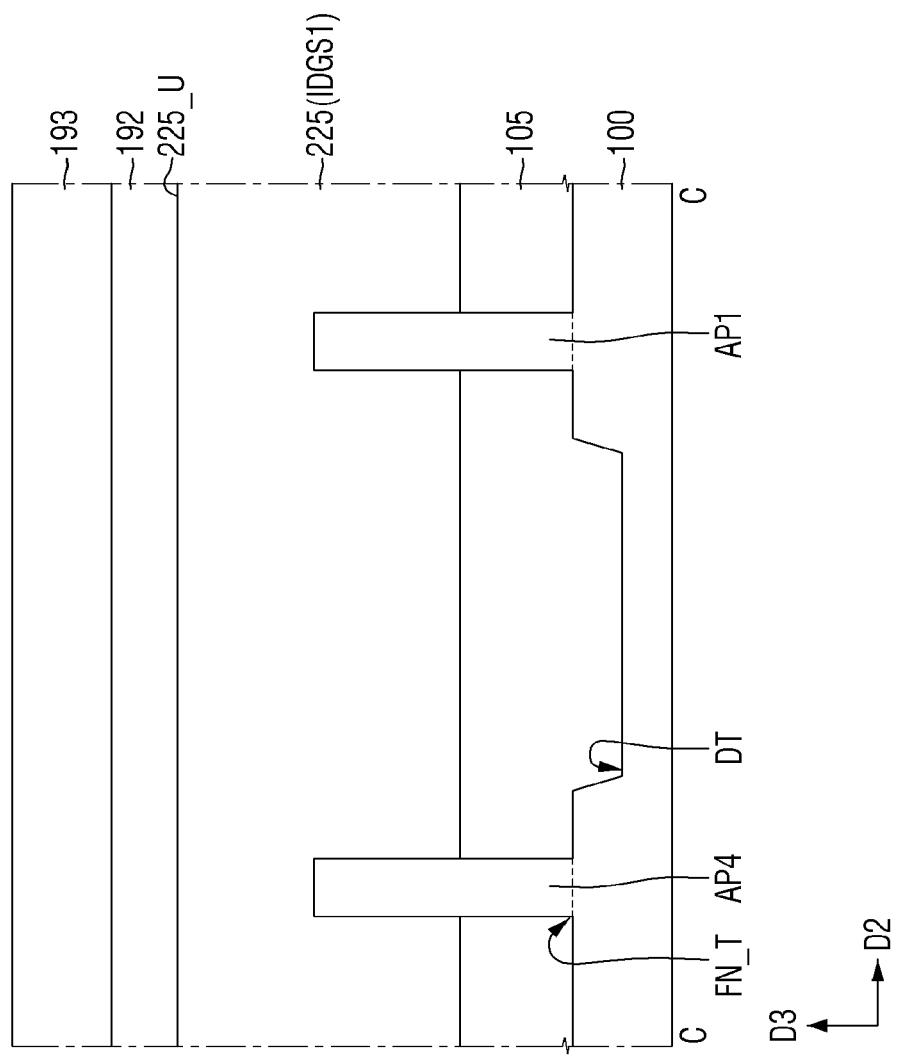

FIGS. 7 and 8 are diagrams of the semiconductor device according to some examples. For convenience of explanation, differences from those explained using FIGS. 1 to 6 will be mainly described. For reference, FIG. 7 is a cross-sectional view taken along a line A-A of FIG. 1, and FIG. 8 is a cross-sectional view taken along a line C-C of FIG. 1.

Referring to FIGS. 7 and 8, in the semiconductor device according to some embodiments, the first dummy gate structure DGS1 may not include a first conductive dummy structure (CDGS1 of FIG. 2). In an implementation, the first dummy gate structure DGS1 may include only the first insulating dummy structure IDGS1.

The first insulating dummy structure IDGS1 may intersect the first active pattern AP1 and the fourth active pattern AP4. The dummy insulation gate 225 of the first insulating dummy structure IDGS1 may intersect the first active pattern AP1 and the fourth active pattern AP4.

The dummy insulation gate 225 of the first insulating dummy structure IDGS1 may cover the first active pattern AP1 and the fourth active pattern AP4 protruding upward from the upper surface of the field insulation film 105. The dummy insulation gate 225 of the first insulating dummy structure IDGS1 may be in contact with the first active pattern AP1 and the fourth active pattern AP4. The dummy insulation gate 225 of the first insulating dummy structure IDGS1 may be in contact with the sidewall of the first active pattern AP1 and the sidewall of the fourth active pattern AP4 protruding upward from the upper surface of the field insulation film 105.

The dummy insulation gate 225 of the first insulating dummy structure IDGS1 may wrap the end of the first active pattern AP1 including the short side of the first active pattern AP1.

Figure 9:
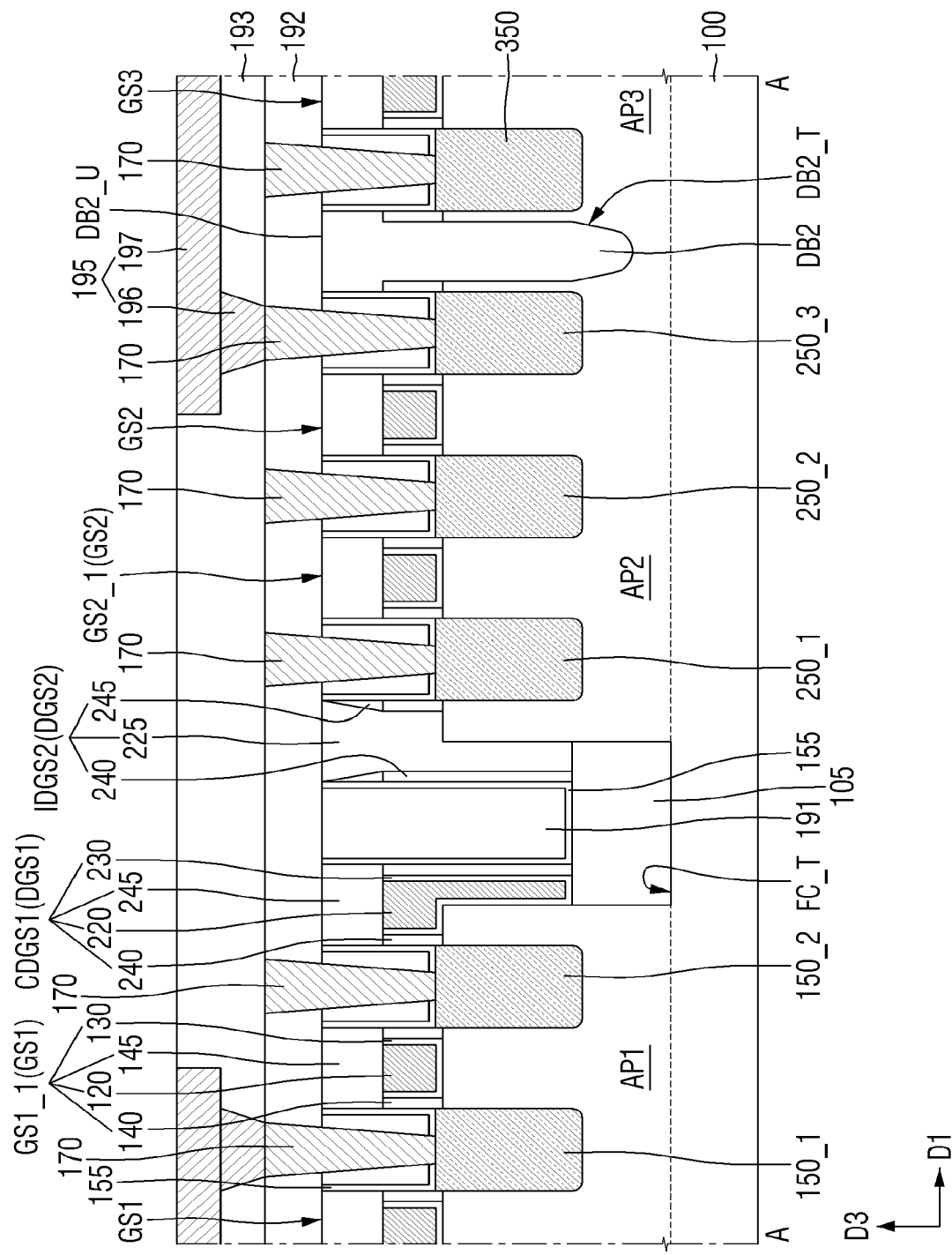
FIGS. 9 and 10 illustrate the semiconductor device according to some embodiments of the present disclosure.
Figure 10:
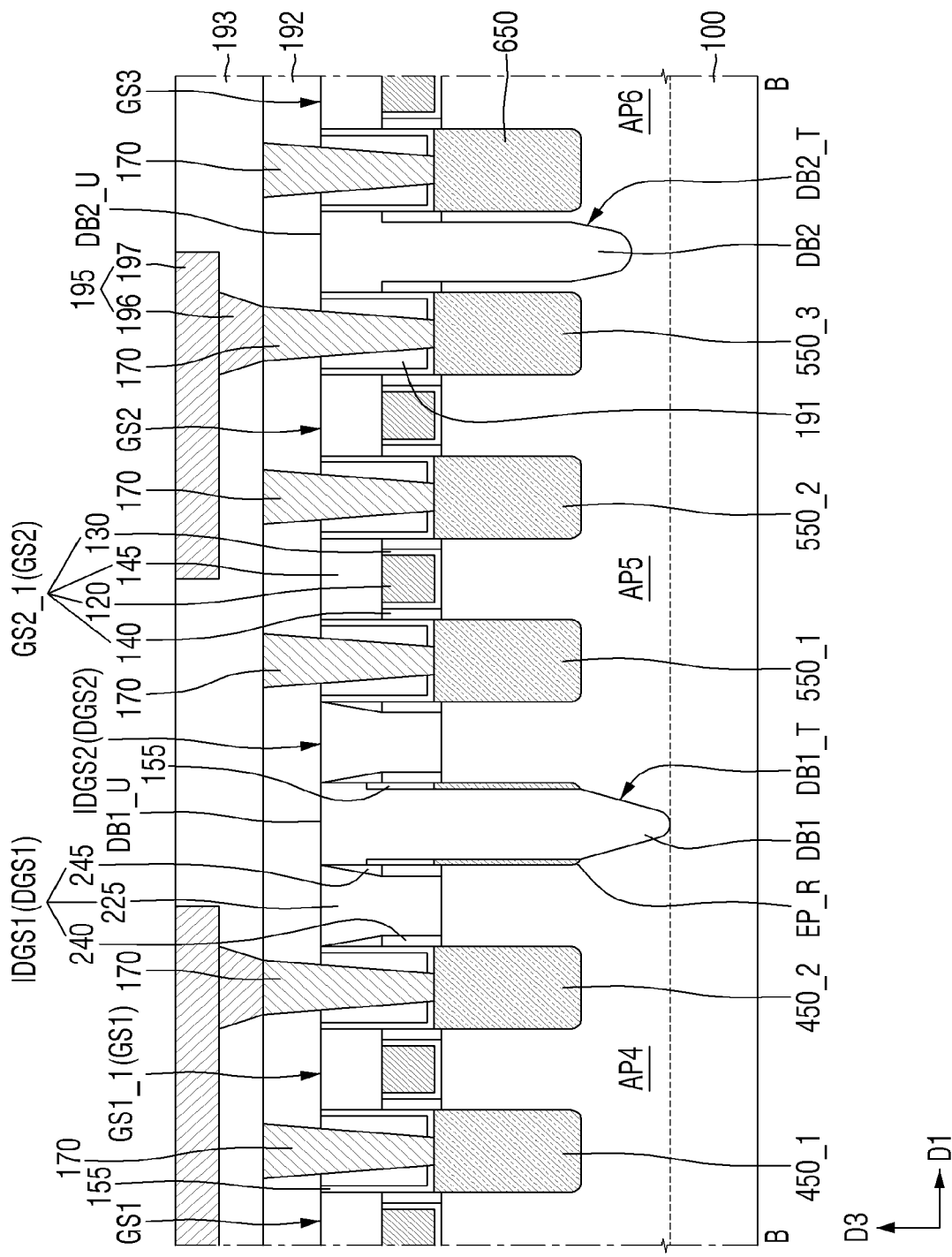

FIGS. 9 and 10 are diagrams of the semiconductor device according to some examples. For convenience of explanation, differences from those explained using FIGS. 1 to 6 will be mainly described. For reference, FIG. 9 is a cross-sectional view taken along a line A-A of FIG. 1, and FIG. 10 is a cross-sectional view taken along a line B-B of FIG. 1.

Referring to FIGS. 9 and 10, in the semiconductor device according to some embodiments, the second dummy gate structure DGS2 may not include the second conductive dummy structure (CDGS2 of FIGS. 2 and 3) but may include a second insulating dummy structure IDGS2.

The second insulating dummy structure IDGS2 may include, e.g., a dummy insulation gate 225, a dummy gate spacer 240, and a dummy gate capping pattern 245. In an implementation, the second insulating dummy structure IDGS2 may not include at least one of the dummy gate spacer 240 and the dummy gate capping pattern 245.

The second insulating dummy structure IDGS2 may intersect the second active pattern AP2 and the fifth active pattern AP5. The dummy insulation gate 225 of the second insulating dummy structure IDGS2 may intersect the second active pattern AP2 and the fifth active pattern AP5. The dummy insulation gate 225 of the second insulating dummy structure IDGS2 may be on the second active pattern AP2 and the fifth active pattern AP5.

The dummy insulation gate 225 of the second insulating dummy structure IDGS2 may cover the second active pattern AP2 and the fifth active pattern AP5 protruding upward from the upper surface of the field insulation film 105. The dummy insulation gate 225 of the second insulating dummy structure IDGS2 may be in contact with the second active pattern AP2 and the fifth active pattern AP5. The dummy insulation gate 225 of the second insulating dummy structure IDGS2 may be in contact with the sidewall of the second active pattern AP2 and the sidewall of the fifth active pattern AP5 protruding upward from the upper surface of the field insulation film 105.

The dummy insulation gate 225 of the second insulating dummy structure IDGS2 may wrap the end of the second active pattern AP2 including the short side of the second active pattern AP2.

The dummy insulation gate 225 of the second insulating dummy structure IDGS2 may be between the first element separation structure DB1 and a second_1 normal gate structure GS2_1 which is closest to the first element separation structure DB1. The dummy insulation gate 225 of the second insulating dummy structure IDGS2 may be between the first element separation structure DB1 and the normal conductive gate 120 of the second_1 normal gate structure GS2_1.

In an implementation, the second dummy gate structure DGS2 may include a second conductive dummy structure CDGS2 and a second insulating dummy structure IDGS2. In an implementation, the second conductive dummy structure CDGS2 may intersect the second active pattern AP2, and may not intersect the fifth active pattern AP5. The second insulating dummy structure IDGS2 may intersect the fifth active pattern AP5 and may not intersect the second active pattern AP2. In an implementation, the second conductive dummy structure CDGS2 may intersect the fifth active pattern AP5 and may not intersect the second active pattern AP2. The second insulating dummy structure IDGS2 may intersect the second active pattern AP2 and may not intersect the fifth active pattern AP5.

Figure 11:
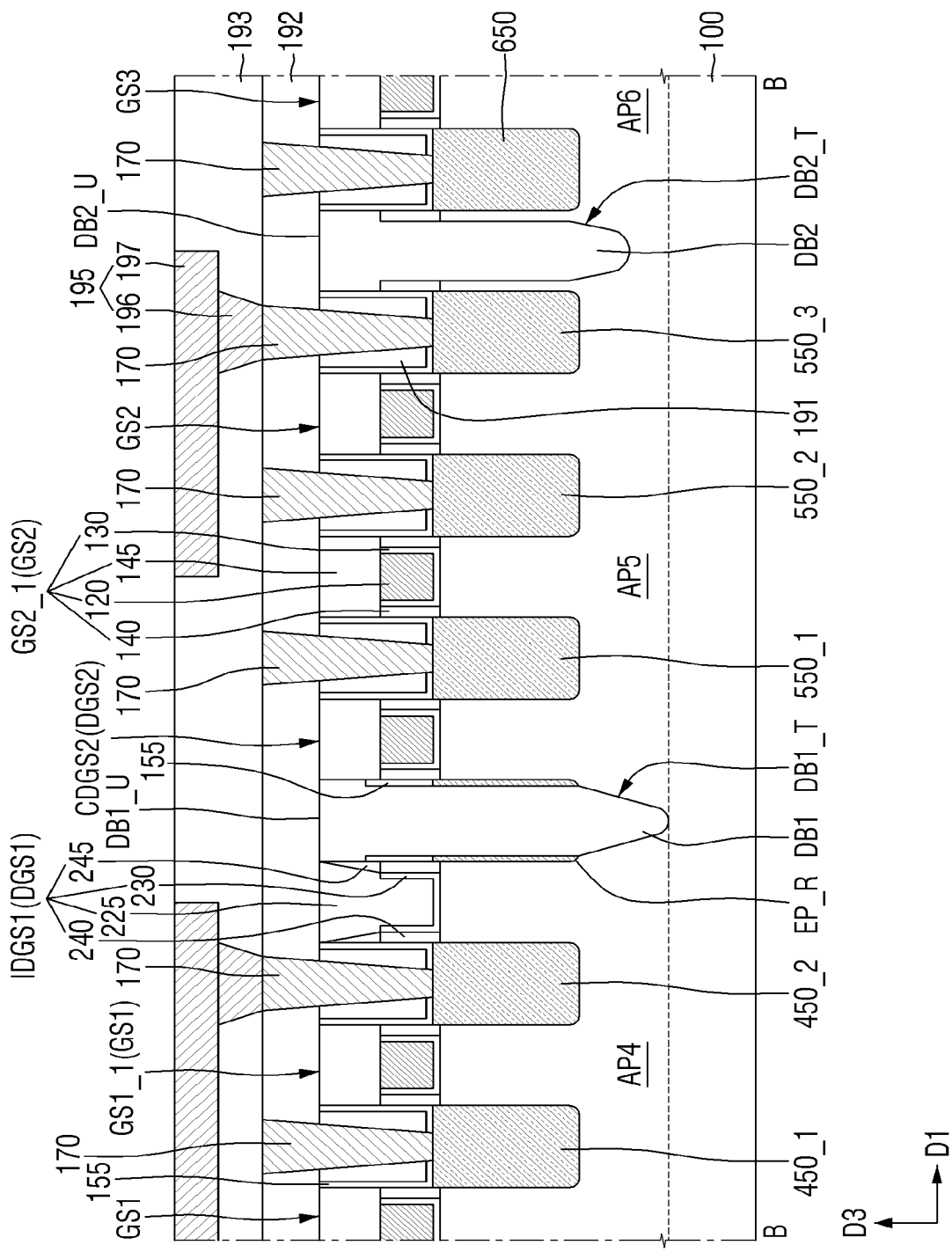
FIGS. 11 and 12 illustrate the semiconductor devices according to some embodiments of the present disclosure.
Figure 12:
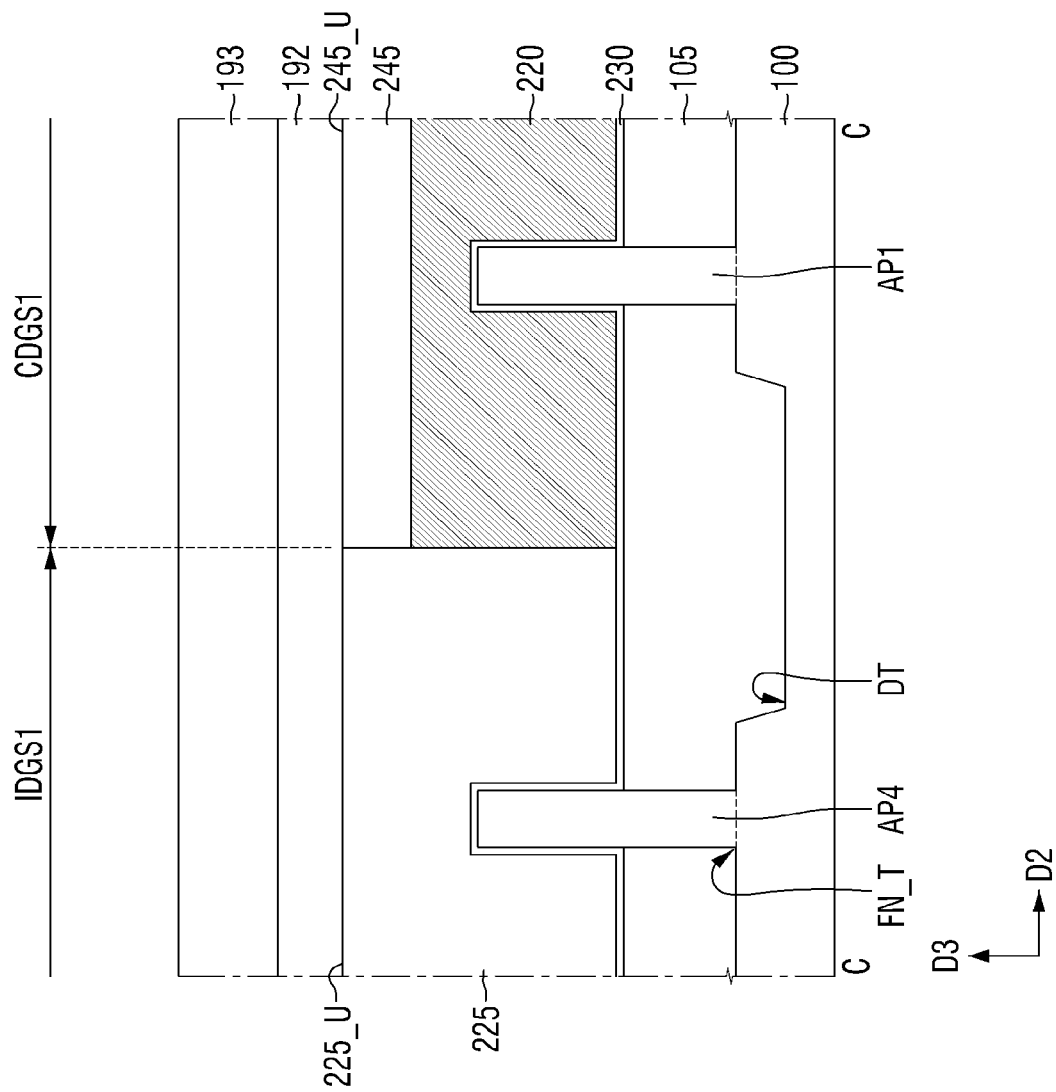

FIGS. 11 and 12 are diagrams of a semiconductor device according to some examples. For convenience of explanation, differences from those explained using FIGS. 1 to 6 will be mainly described.

For reference, FIG. 11 is a cross-sectional view taken along a line A-A of FIG. 1, and FIG. 12 is a cross-sectional view taken along a line C-C of FIG. 1.

Referring to FIGS. 11 and 12, in the semiconductor device according to some embodiments, the first insulating dummy structure IDGS1 may include a dummy gate insulation film 230.

The dummy insulation gate 225 may be on the dummy gate insulation film 230. The dummy gate insulation film 230 of the first insulating dummy structure IDGS1 may extend along a profile of the fourth active pattern AP4 protruding upward from the upper surface of the field insulation film 105.

The dummy gate insulation film 230 of the first insulating dummy structure IDGS1 may be directly connected to the dummy gate insulation film 230 of the first conductive dummy structure CDGS1.

The dummy gate insulation film 230 of the first insulating dummy structure IDGS1 may be an insulation liner, and the dummy insulation gate 225 of the first insulating dummy structure IDGS1 may be a filling insulation pattern that fills a space defined by the insulation liner.

FIGS. 13 to 16 are diagrams of a semiconductor device according to some embodiments. For convenience of explanation, differences from those explained using FIGS. 1 to 6 will be mainly described.

Figure 13:
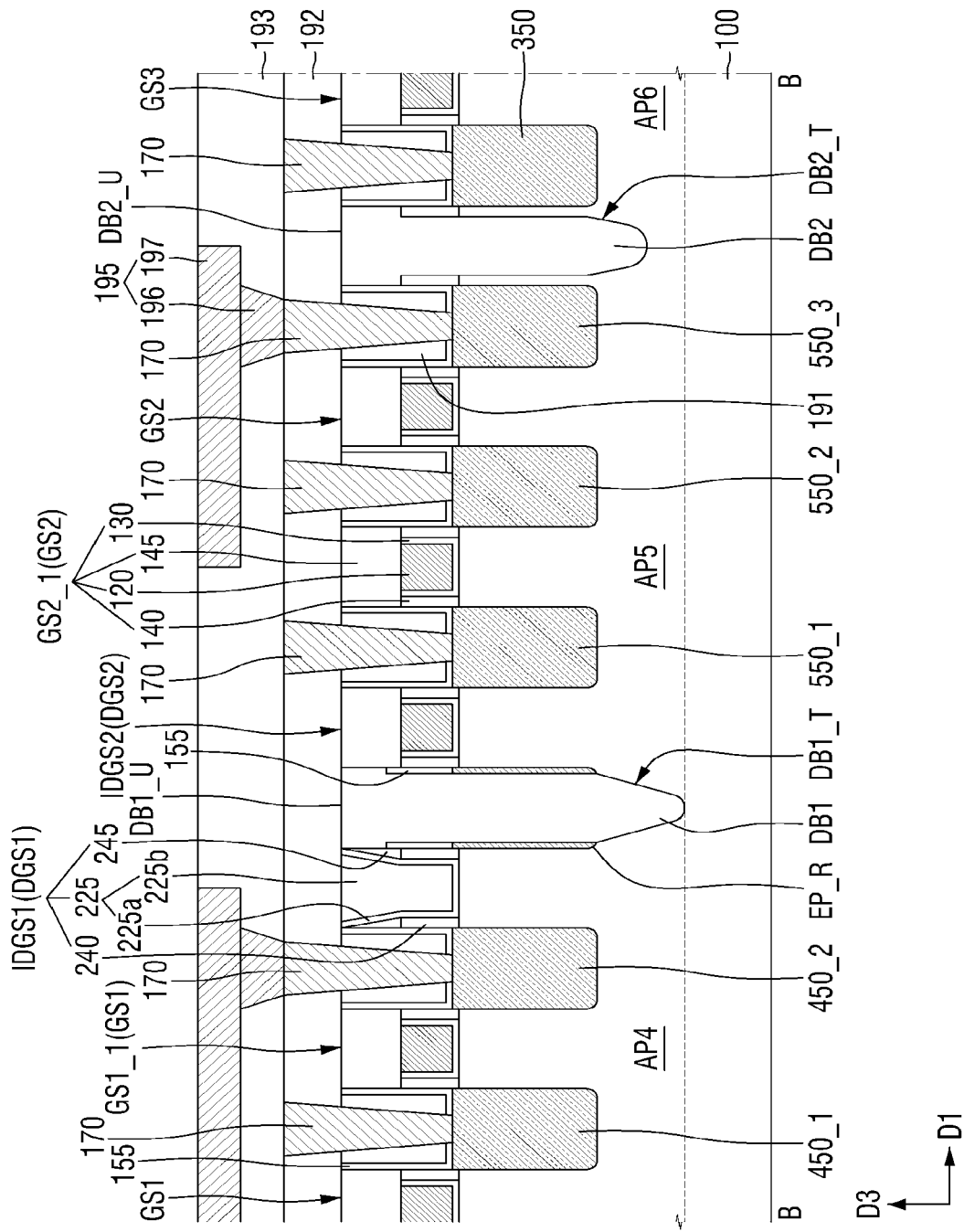
FIGS. 13 to 16 illustrate the semiconductor device according to some embodiments of the present disclosure.
Figure 14:
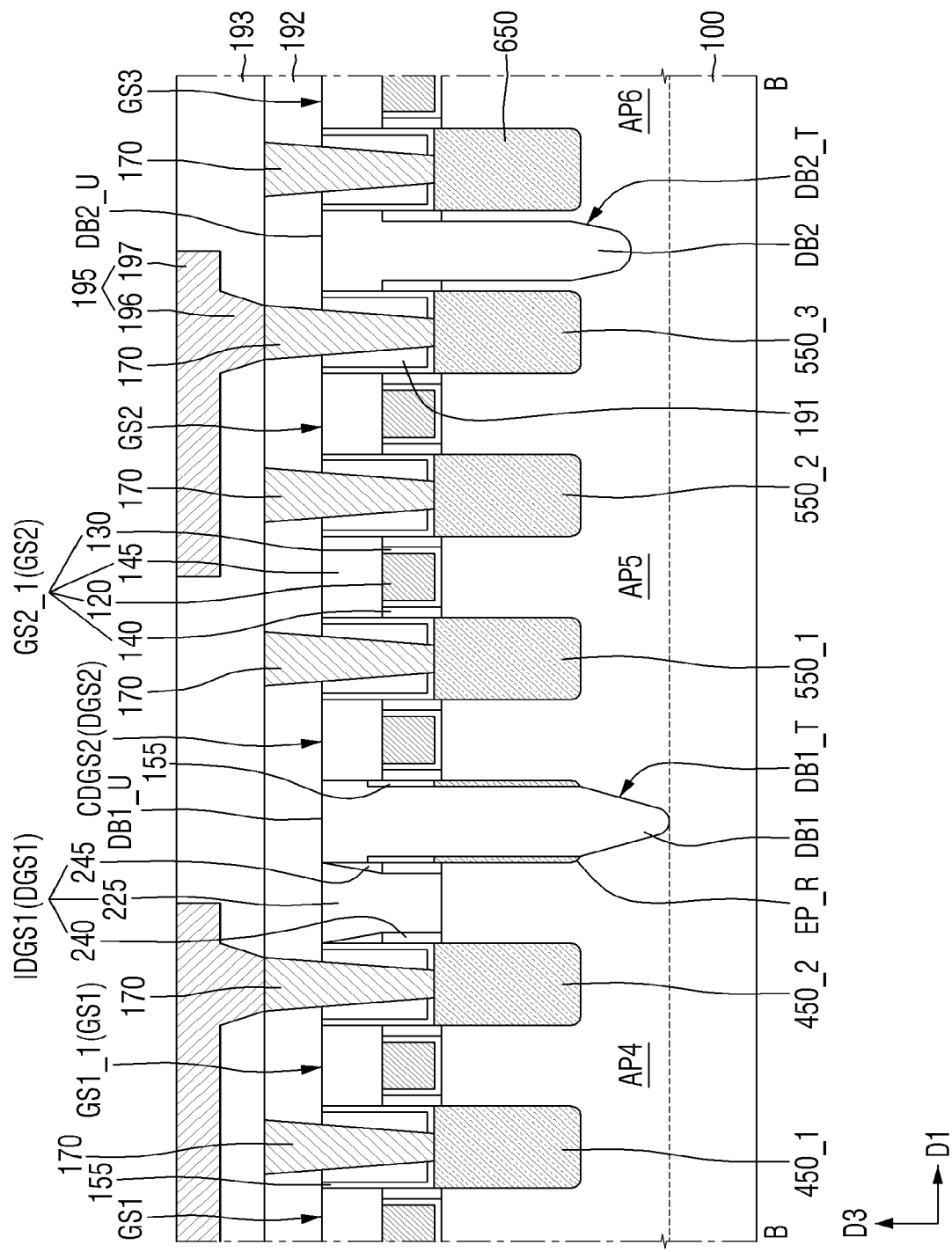
Figure 15:
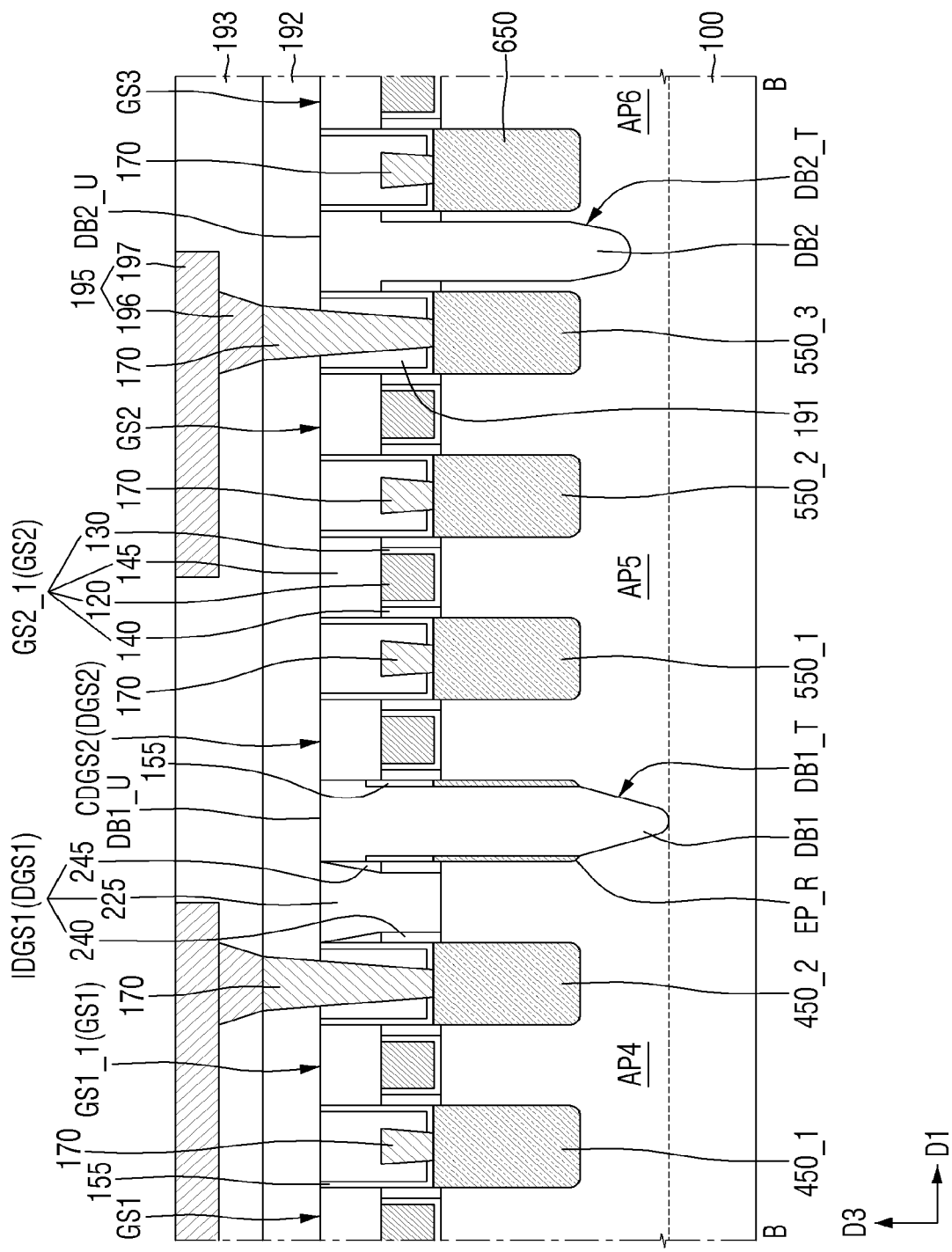
Figure 16:
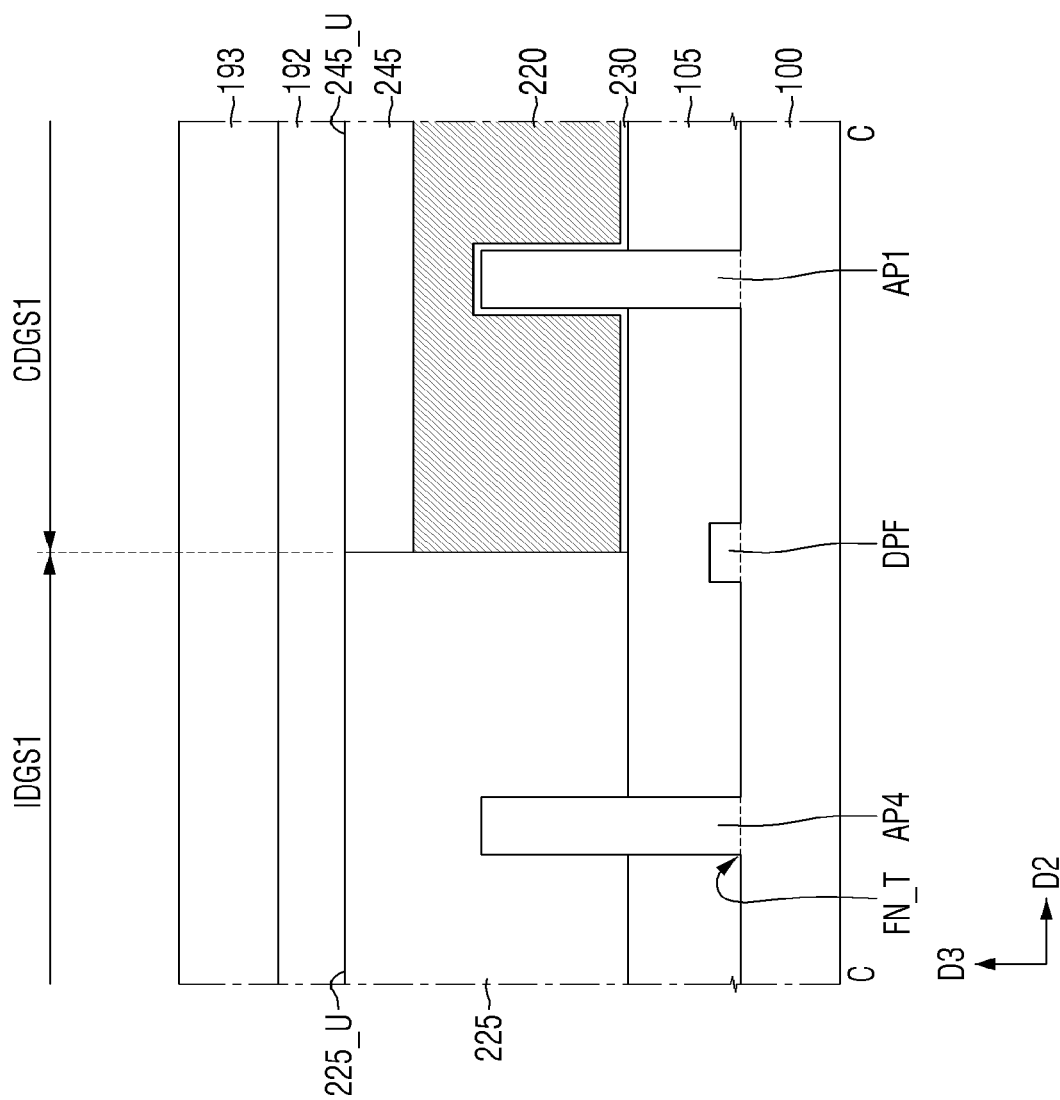

For reference, FIGS. 13 to 15 are cross-sectional views taken along a line B-B of FIG. 1, and FIG. 16 is a cross-sectional view taken along a line C-C of FIG. 1.

Referring to FIG. 13, in the semiconductor device according to some embodiments, the dummy insulation gate 225 may include a lower insulating pattern 225a, and an upper insulating pattern 225b on the lower insulating pattern 225a.

The lower insulating pattern 225a may include a bottom part extending along the upper surface of the fourth active pattern AP4, and a sidewall part extending from the bottom part in the third direction D3. The upper insulating pattern 225b may fill the space defined by the lower insulating pattern 225a. The lower insulating pattern 225a may include a material different from the upper insulating pattern 225b.

Referring to FIG. 14, in the semiconductor devices according to some examples, the via 196 and the wiring pattern 197 may not be divided by the wiring barrier film. The wiring filling film of the via 196 and the wiring filling film of the wiring pattern 197 may be directly connected to each other (e.g., continuous with each other to form a monolithic, one piece structure).

Referring to FIG. 15, in the semiconductor device according to some embodiments, the source/drain contact 170 may include a connected part connected to the wiring structure 195, and a non-connected part that is not connected to the wiring structure 195.

An upper surface of the connected part of the source/drain contact 170 may be on the same plane as an upper surface of the second interlayer insulation film 192. The upper surface of the non-connected part of the source/drain contact 170 may be lower than the upper surface of the connected part of the source/drain contact 170. The upper surface of the non-connected part of the source/drain contact 170 may be lower than the upper surfaces of the gate structures GS1 to GS3 and DGS1 to DGS3.

Referring to FIG. 16, the semiconductor device according to some embodiments may include a dummy protrusion pattern DPF in a field region between the first active region $R_N$ and the second active region $R_P$. A deep trench (DT of FIG. 4A) may not be formed in the field region. An upper surface of the dummy protrusion pattern DPF may be covered with the field insulation film 105.

Figure 17:
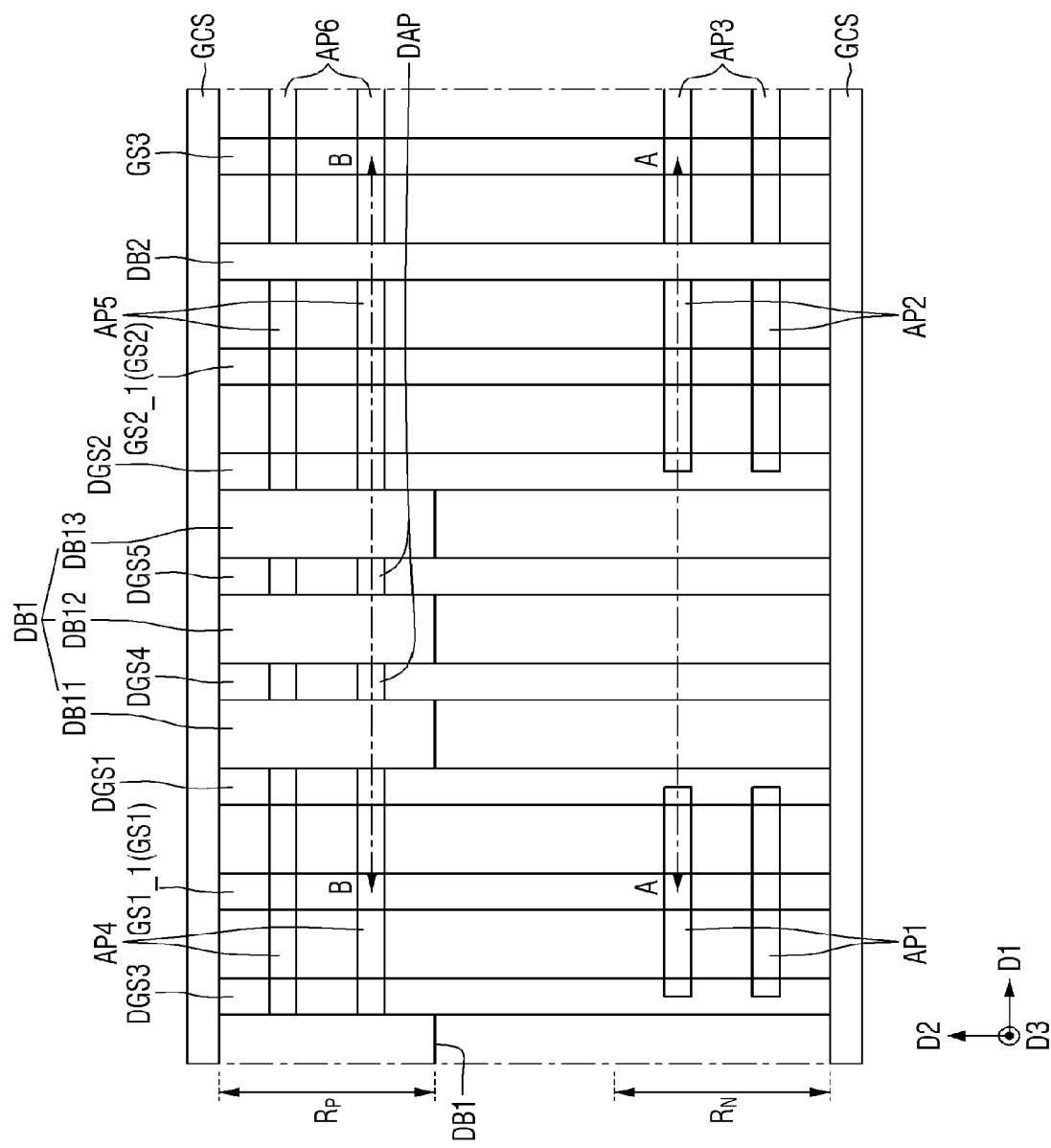
FIGS. 17 to 19 illustrate the semiconductor device according to some embodiments of the present disclosure.
Figure 18:
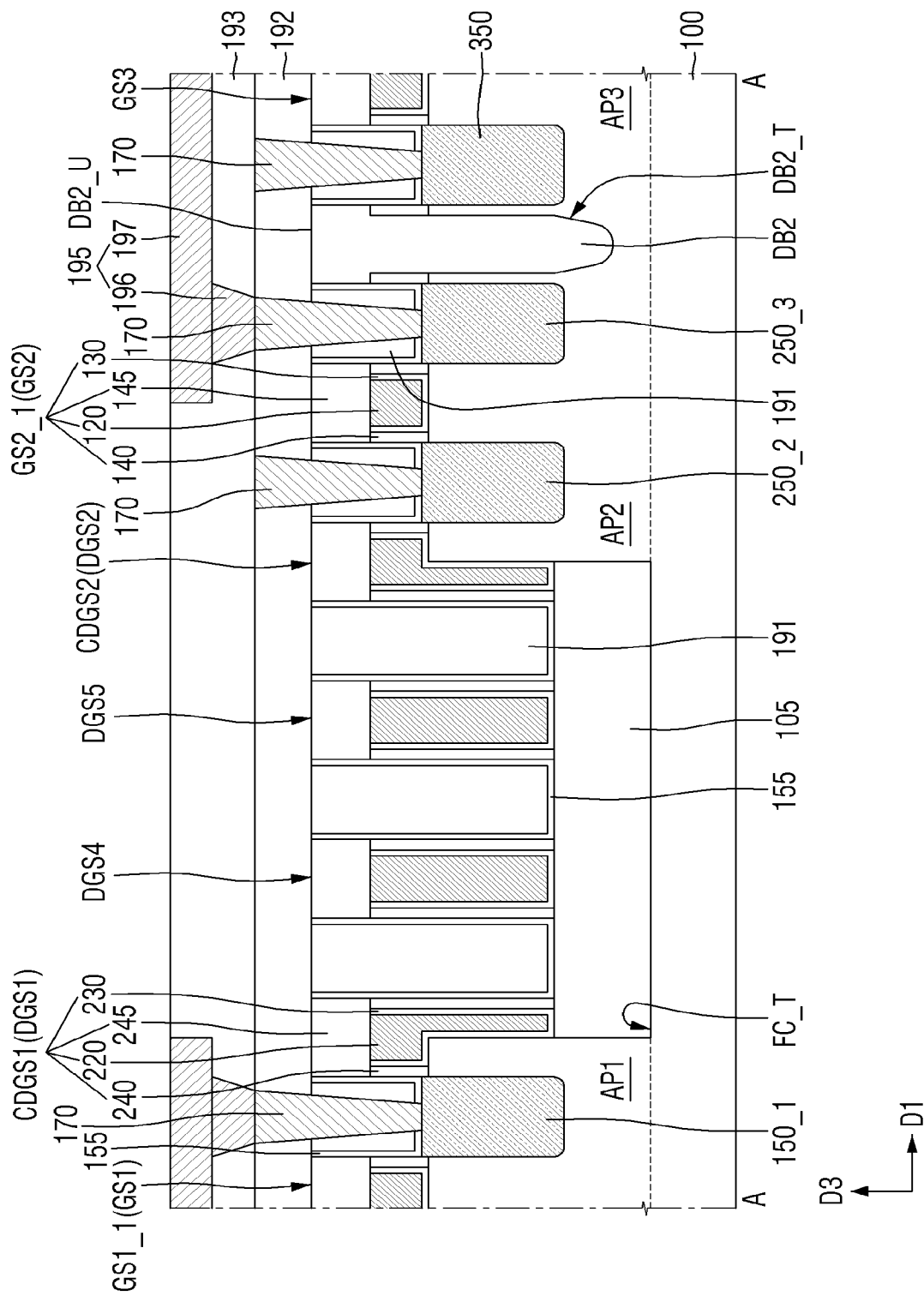
Figure 19:
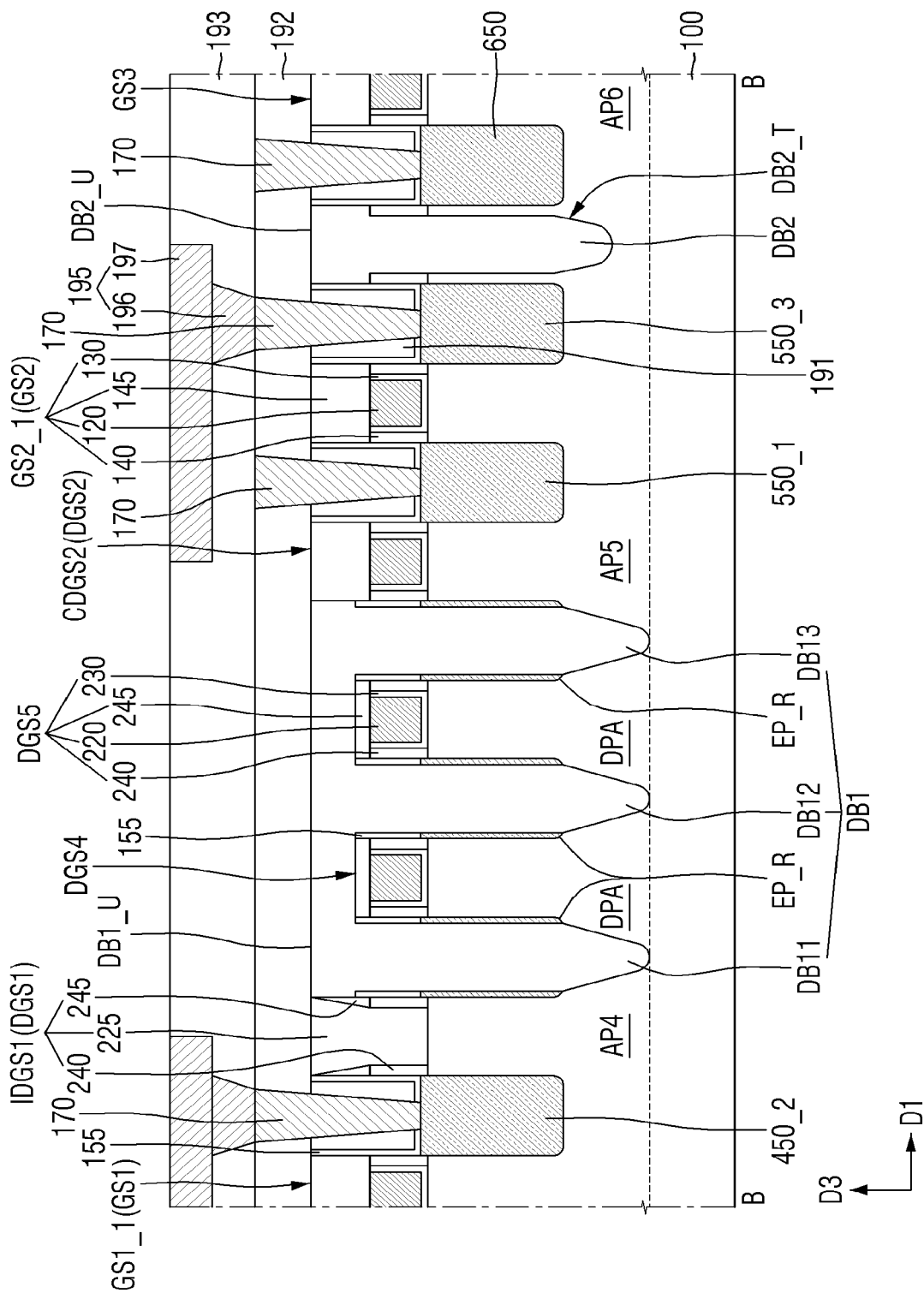

FIGS. 17 to 19 are diagrams of a semiconductor device according to some embodiments. For convenience of explanation, differences from those explained using FIGS. 1 to 6 will be mainly described. For reference, FIG. 17 is an exemplary layout diagram for explaining a semiconductor device according to some embodiments. FIGS. 18 and 19 are cross-sectional views taken along lines A-A and B-B of FIG. 19.

Referring to FIGS. 17 to 19, the semiconductor device according to some embodiments may further include a fourth dummy gate structure DGS4 and a fifth dummy gate structure DGS5 between the first dummy gate structure DGS1 and the second dummy gate structure DGS2 and extending in the second direction D2.

The fourth dummy gate structure DGS4 may be spaced apart from the fifth dummy gate structure DGS5 in the first direction D1. The fourth dummy gate structure DGS4 and the fifth dummy gate structure DGS5 may not intersect the first active pattern AP1 and the second active pattern AP2. The fourth dummy gate structure DGS4 and the fifth dummy gate structure DGS5 may pass between the first active pattern AP1 and the second active pattern AP2. In an implementation, the fourth dummy gate structure DGS4 and the fifth dummy gate structure DGS5 may not be on the first active pattern AP1 and the second active pattern AP2. The fourth dummy gate structure DGS4 and the fifth dummy gate structure DGS5 may be on the field insulation film 105 in the fin-cut trench FC_T, between the first active pattern AP1 and the second active pattern AP2.

The fourth dummy gate structure DGS4 and the fifth dummy gate structure DGS5 may not intersect the fourth active pattern AP4 and the fifth active pattern AP5. The fourth dummy gate structure DGS4 and the fifth dummy gate structure DGS5 may pass between the fourth active pattern AP4 and the fifth active pattern AP5. In an implementation, the fourth dummy gate structure DGS4 and the fifth dummy gate structure DGS5 may not be on the fourth active pattern AP4 and the fifth active pattern AP5. Between the fourth active pattern AP4 and the fifth active pattern AP5, the fourth dummy gate structure DGS4 and the fifth dummy gate structure DGS5 may be on the dummy active pattern DAP between the fourth active pattern AP4 and the fifth active pattern AP5. The dummy active pattern DAP may be separated from the fourth active pattern AP4 and the fifth active pattern AP5 by the first element separation structure DB1.

In an implementation, each of the fourth dummy gate structure DGS4 and the fifth dummy gate structure DGS5 may include a dummy conductive gate 220, a dummy gate insulation film 230, a dummy gate spacer 240 and a dummy gate capping pattern 245. The dummy conductive gates 220 of the fourth dummy gate structure DGS4 and the fifth dummy gate structure DGS5 may pass between the first active pattern AP1 and the second active pattern AP2, and between the fourth active pattern AP4 and the fifth active pattern AP5. The dummy conductive gates 220 of the fourth dummy gate structure DGS4 and the fifth dummy gate structure DGS5 may be on the dummy active pattern DAP.

The first element separation structure DB1 may include a plurality of element separation patterns DB11, DB12 and DB13. The first element separation pattern DB11 may be between the first dummy gate structure DGS1 and the fourth dummy gate structure DGS4. The second element separation pattern DB12 may be between the fourth dummy gate structure DGS4 and the fifth dummy gate structure DGS5. The third element separation pattern DB13 may be between the fifth dummy gate structure DGS5 and the second dummy gate structure DGS2.

In an implementation, the first to third element separation patterns DB11, DB12 and DB13 may be connected to each other on or over the fourth dummy gate structure DGS4 and the fifth dummy gate structure DGS5. In an implementation, the first to third element separation patterns DB11, DB12 and DB13 may be spaced apart from each other.

A dummy active pattern DAP may be between the adjacent element separation patterns DB11, DB12, DB13.

In an implementation, two dummy gate structures, which do not intersect the first active pattern AP1 and the second active pattern AP2, may be between the first dummy gate structure DGS1 and the second dummy gate structure DGS2. In an implementation, a number of dummy gate structures that do not intersect the first active pattern AP1 and the second active pattern AP2 may be one or three or more between the first dummy gate structure DGS1 and the second dummy gate structure DGS2.

In an implementation, the fourth dummy gate structure DGS4 and the fifth dummy gate structure DGS5 may include the dummy insulation gate 225, like the first insulating dummy structure IDGS1.

Figure 20:
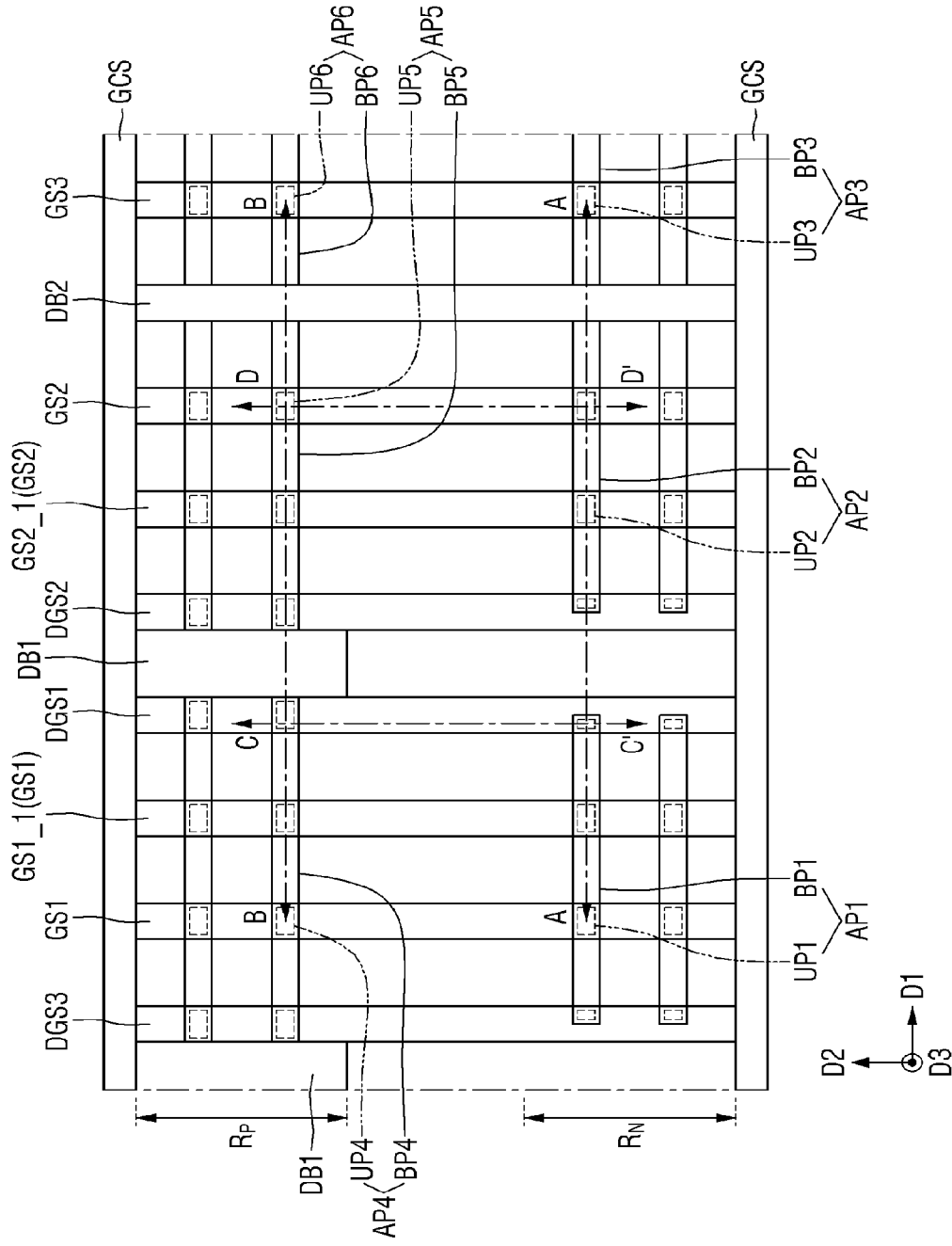
FIGS. 20 to 24 illustrate the semiconductor device according to some embodiments of the present disclosure.

FIGS. 20 to 24 are diagrams of a semiconductor device according to some embodiments. For convenience of explanation, differences from those explained using FIGS. 1 to 6 will be mainly described. For reference, FIG. 20 is an exemplary layout diagram for explaining a semiconductor device according to some embodiments. FIGS. 21 to 24 are cross-sectional views taken along lines A-A, B-B, C, -C and D-D of FIG. 20.

Referring to FIGS. 20 to 24, in the semiconductor device according to some embodiments, each of the first to sixth active patterns AP1 to AP6 may include the first to sixth lower active patterns BP1 to BP6, and first to sixth sheet patterns UP1 to UP6.

The first to third lower activity patterns BP1 to BP3 may be spaced apart from each other in the first direction D1 and arranged in the first direction D1. The first lower active pattern BP1 and the second lower active pattern BP2 may be separated by a fin-cut trench FC_T. The first lower active pattern BP1 and the second lower active pattern BP2 may be separated by the field insulation film 105 in the fin-cut trench FC_T. The second lower active pattern BP2 and the third lower active pattern BP3 may be separated by the second element separation trench DB2_T. The second lower active pattern BP2 and the third lower active pattern BP3 may be separated by the second element separation structure DB2.

The fourth to sixth lower activity patterns BP4 to BP6 may be spaced apart from each other in the first direction D1 and arranged in the first direction D1. The fourth lower active pattern BP4 and the fifth lower active pattern BP5 may be separated by the first element separation trench DB1_T. The fourth lower active pattern BP4 and the fifth lower active pattern BP5 may be separated by the first element separation structure DB1. The fifth lower active pattern BP5 and the sixth lower active pattern BP6 may be separated by the second element separation trench DB2_T. The fifth lower active pattern BP5 and the sixth lower active pattern BP6 may be separated by the second element separation structure DB2.

A first sheet pattern UP1 may be on the first lower active pattern BP1 and separated from the first lower active pattern BP1. The first sheet pattern UP1 may include a plurality of sheet patterns. In an implementation, three first sheet patterns UP may be included. The explanation for the second to sixth sheet patterns UP2 to UP6 may be similar to the explanation for the first sheet pattern UP1.

Each of the first to sixth sheet patterns UP1 to UP6 may be connected to the first to sixth source/drain patterns 150_1, 150_2, 250_1, 250_2, 250_3, 350, 450_1, 450_2, 550_1, 550_2, 550_3 and 650. Each of the first to sixth sheet patterns UP1 to UP6 may be channel patterns used as channel regions of a transistor. In an implementation, each of the first to sixth sheet patterns UP1 to UP6 may be a nanosheet or a nanowire.

Each of the first dummy gate structure DGS1 and the third dummy gate structure DGS3 may be on the first lower active pattern BP1 and the fourth lower active pattern BP4. The first dummy gate structure DGS1 and the third dummy gate structure DGS3 may wrap a first sheet pattern UP1 near the end of the first lower active pattern BP1, and a fourth sheet pattern UP4 near the end of the fourth lower active pattern BP4.

The dummy conductive gate 220 of the first conductive dummy structure CDGS1 may wrap the first sheet pattern UP1 near the end of the first lower active pattern BP1. The dummy insulation gate 225 of the first insulating dummy structure IDGS1 may wrap the fourth sheet pattern UP4 near the end of the fourth lower active pattern BP4. The dummy insulation gate 225 may be between the fourth sheet patterns UP4 spaced apart from each other in the third direction D3.

The second dummy gate structure DGS2 may be on the second lower active pattern BP2 and the fifth lower active pattern BP5. The second dummy gate structure DGS2 may wrap a second sheet pattern UP2 near the end of the second lower active pattern BP2 and a fifth sheet pattern UP5 near the end of the fifth lower active pattern BP5. The dummy conductive gate 220 of the second conductive dummy structure CDGS2 may wrap the second sheet pattern UP2 near the end of the second lower active pattern BP2 and a fifth sheet pattern UP5 near the end of the fifth lower active pattern BP5.

The first normal gate structure GS1 may be on the first lower active pattern BP1 and the fourth lower active pattern BP4. The normal conductive gate 120 of the first normal gate structure GS1 may wrap the first sheet pattern UP1 and the fourth sheet pattern UP4. The second normal gate structure GS2 may be on the second lower active pattern BP2 and the fifth lower active pattern BP5. The normal conductive gate 120 of the second normal gate structure GS2 may wrap the second sheet pattern UP2 and the fifth sheet pattern UP5. The third normal gate structure GS3 may be on the third lower active pattern BP3 and the sixth lower active pattern BP6. The normal conductive gate 120 of the third normal gate structure GS3 may wrap the third sheet pattern UP3 and the sixth sheet pattern UP4.

Figure 21:
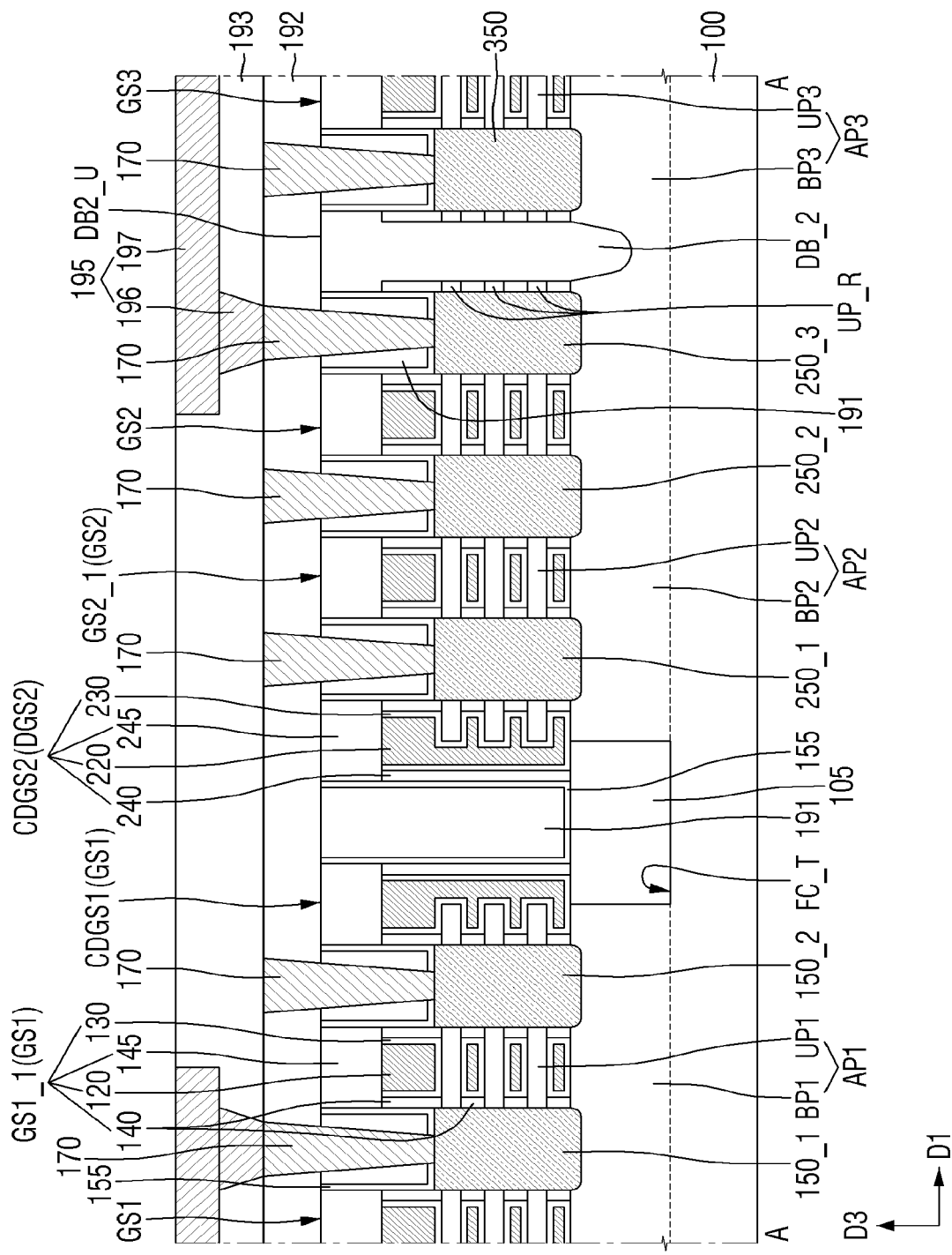

In an implementation, as illustrated in FIG. 21, the normal gate spacer 140 may be between the first source/drain patterns 150_1 and 150_2 and the normal conductive gate 120 between the first sheet patterns UP1. The normal gate spacer 140 between the first sheet patterns UP1 may be an inner spacer. The normal gate spacer 140 on the first sheet pattern UP1 at the uppermost part may be an outer spacer. A structure of the inner spacer may or may not be the same as that of the outer spacer.

Figure 22:
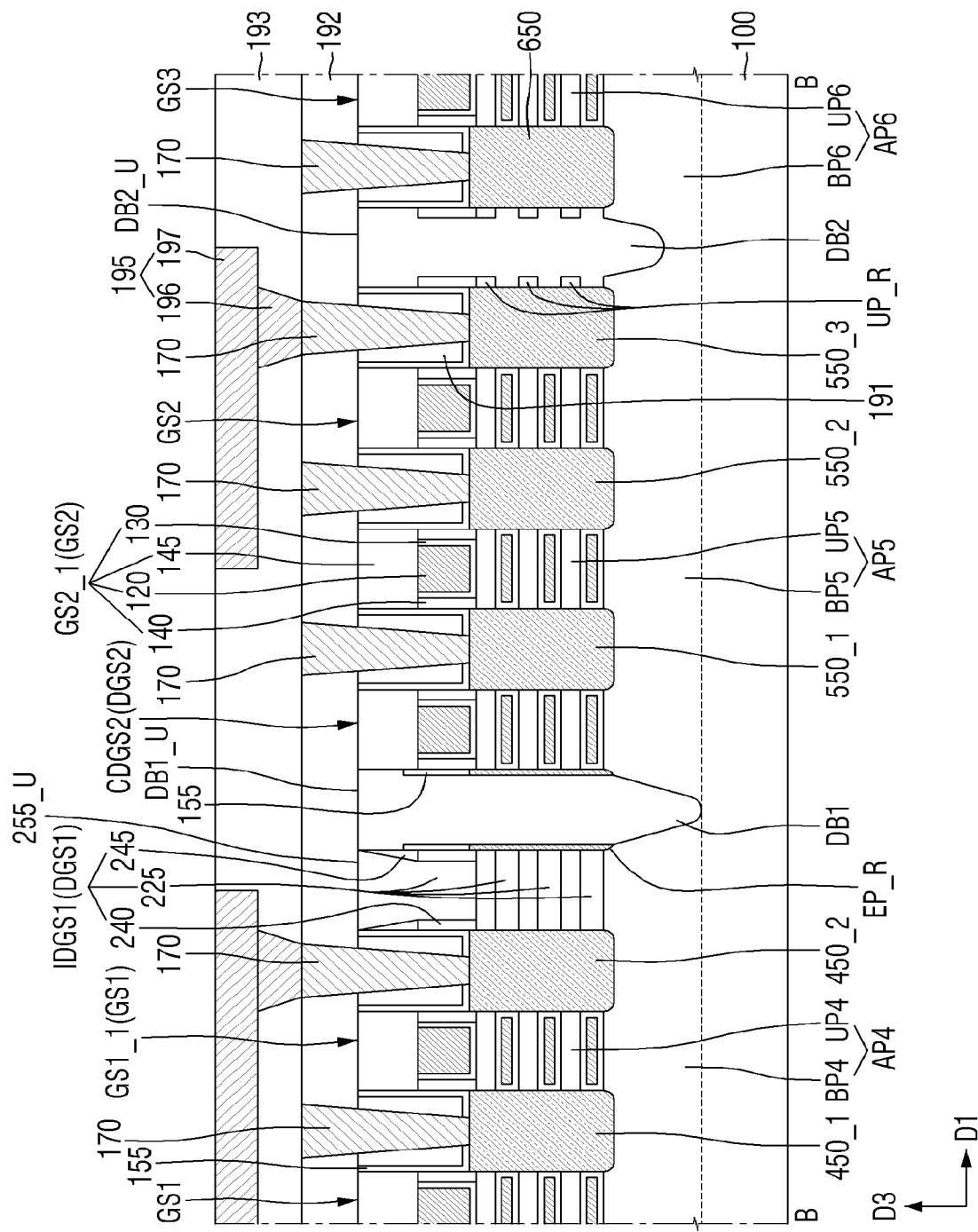
Figure 23:
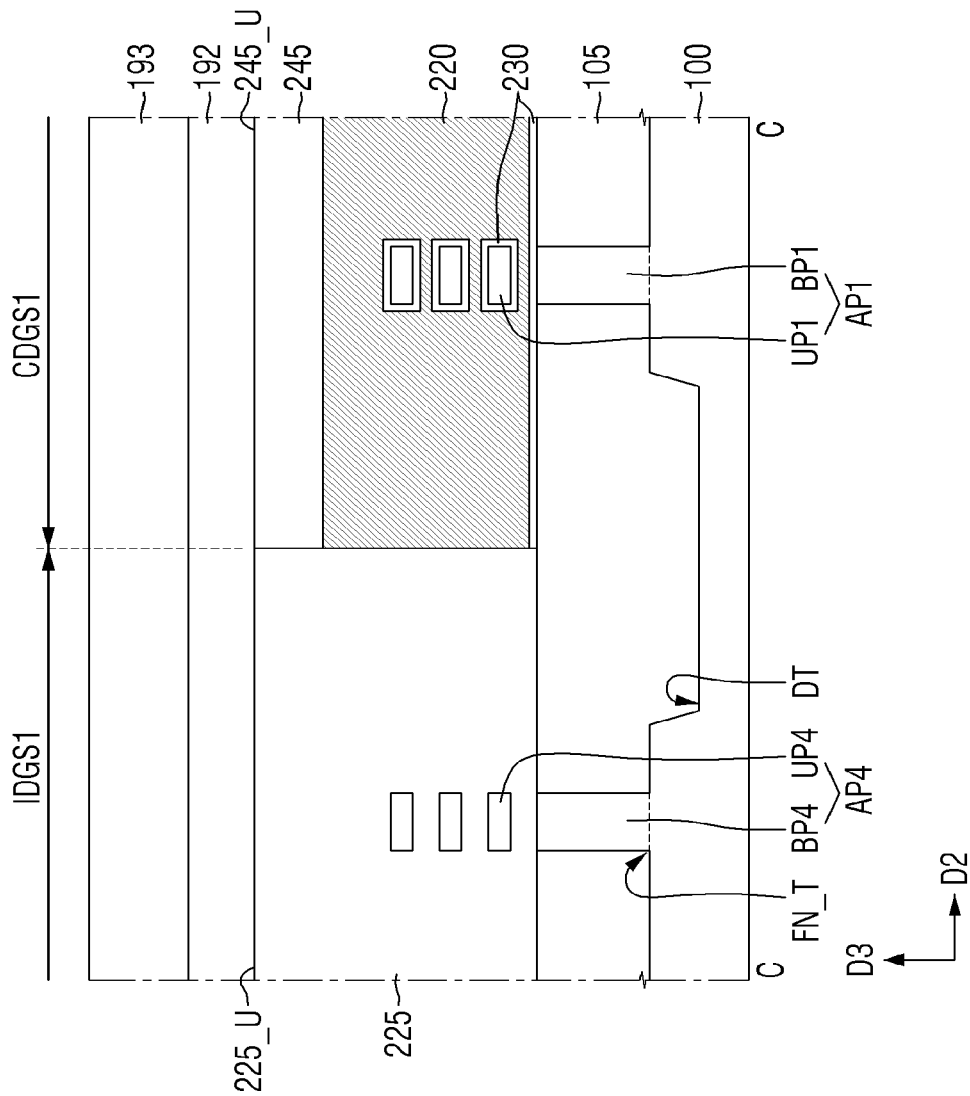
Figure 24:
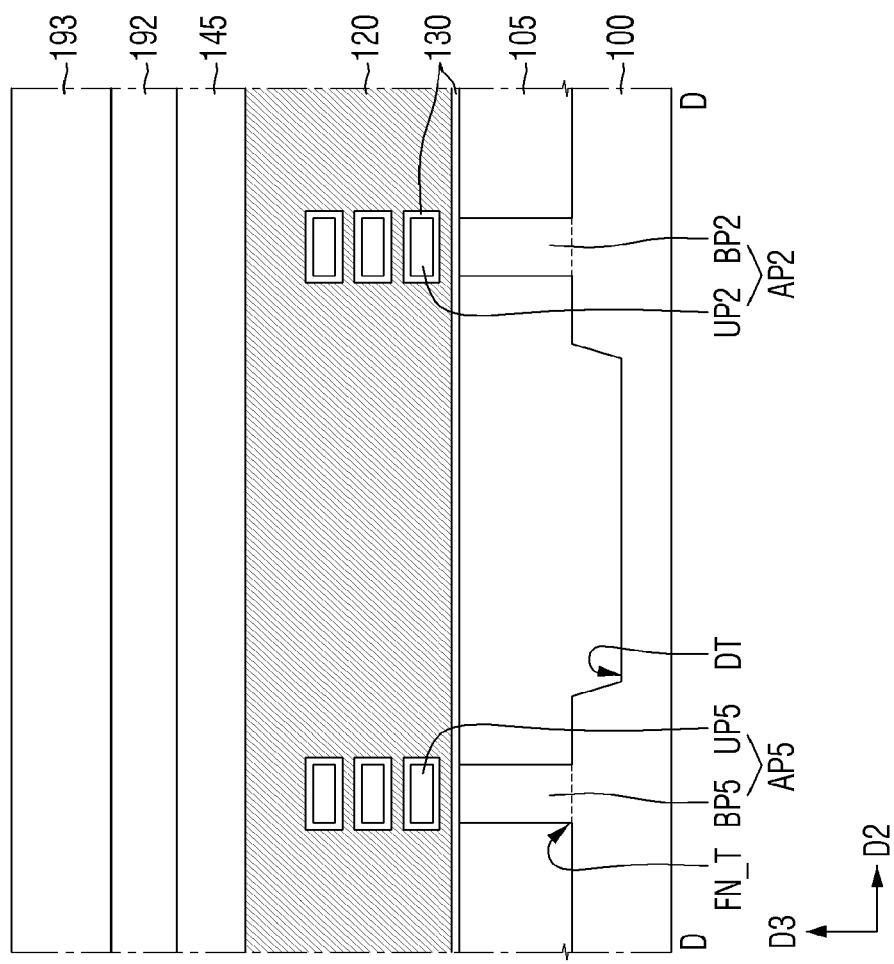

In FIG. 22, the normal gate spacer 140 may not be between the fourth source/drain patterns 450_1 and 450_2 and the normal conductive gate 120 between the fourth sheet patterns UP4.

In an implementation, the normal gate spacer 140 may not be between the first source/drain patterns 150_1 and 150_2 and the normal conductive gate 120 between the first sheet patterns UP1. In an implementation, the normal gate spacer 140 may be between the fourth source/drain patterns 450_1 and 450_2 and the normal conductive gate 120 between the fourth sheet patterns UP4.

Sheet pattern pieces UP_R may remain on a part of the sidewall of the second element separation structure DB2. In an implementation, the sheet pattern pieces UP_R may not be on the sidewall of the second element separation structure DB2.

In an implementation, as illustrated in FIG. 21, the above-mentioned inner spacer may remain between the sheet pattern pieces UP_R. In an implementation, no inner spacer may remain between the sheet pattern pieces UP_R.

As shown in FIGS. 7 and 8, the first dummy gate structure DGS1 may include only the first insulating dummy structure IDGS1. In such a case, the dummy insulation gate 225 of the first insulating dummy structure IDGS1 may intersect the first lower active pattern BP1 and the fourth lower active pattern BP4. The dummy insulation gate 225 of the first insulating dummy structure IDGS1 may wrap the first sheet pattern UP1 and the fourth sheet pattern UP4.

As shown in FIGS. 9 and 10, the second dummy gate structure DGS2 may not include the second conductive dummy structure CDGS2 and may include the second insulating dummy structure IDGS2. In such a case, the dummy insulation gate 225 of the second insulating dummy structure IDGS2 may intersect the second lower active pattern BP2 and the fifth lower active pattern BP5. The dummy insulation gate 225 of the second insulating dummy structure IDGS2 may wrap the second sheet pattern UP2 and the fifth sheet pattern UP5.

Figure 25:
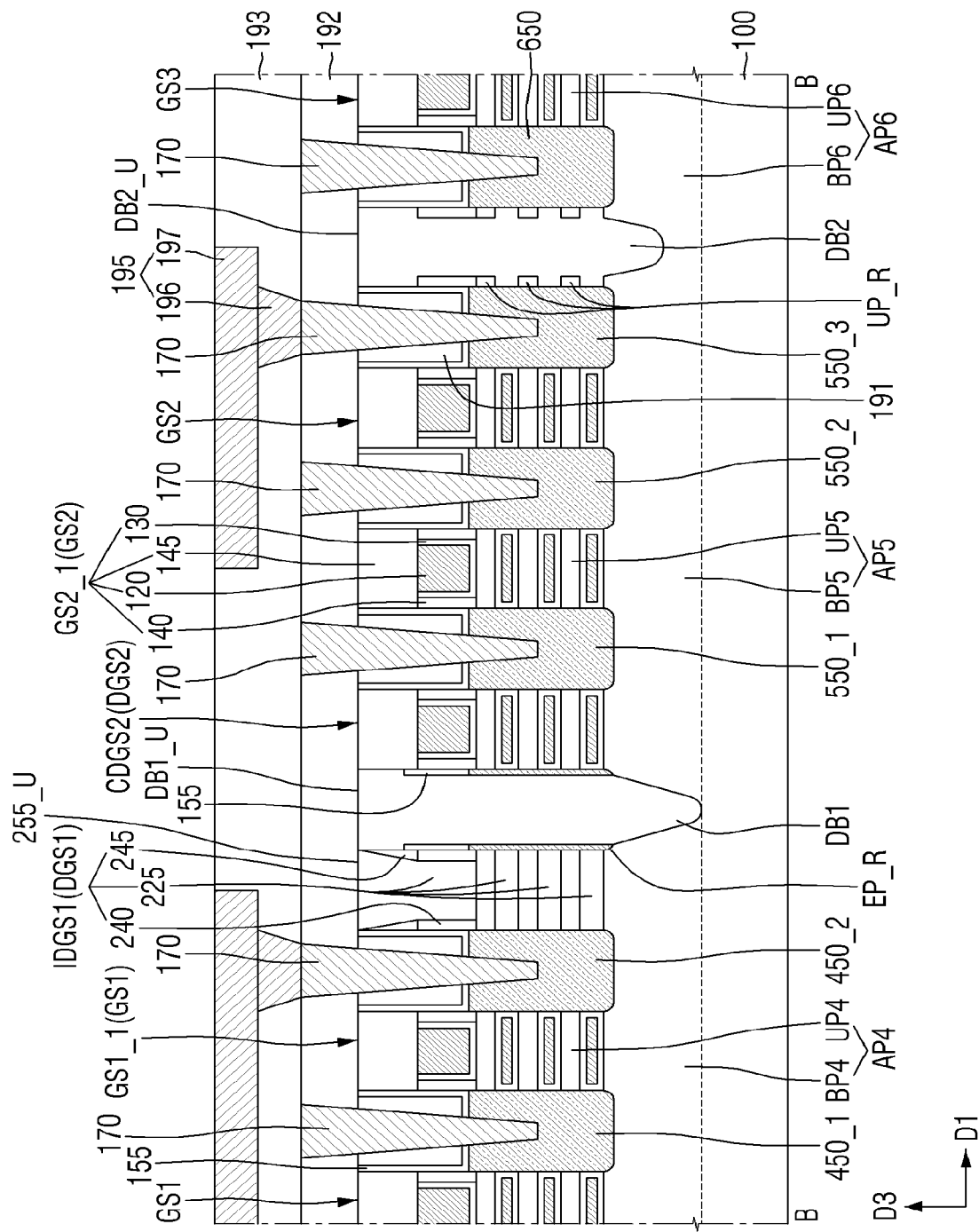
FIG. 25 illustrates the semiconductor device according to some embodiments of the present disclosure.

FIG. 25 is a diagram of a semiconductor device according to some examples. For convenience of explanation, differences from those explained using FIGS. 20 to 24 will be mainly described.

Referring to FIG. 25, in the semiconductor device according to some embodiments, some of the source/drain contacts 170 may be inserted into the first to sixth source/drain patterns 150_1, 150_2, 250_1, 250_2, 250_3, 350, 450_1, 450_2, 550_1, 550_2, 550_3 and 650.

A bottom surface of the source/drain contact 170 may be, e.g., between the upper surface of the first sheet pattern placed at the lowermost part of the plurality of first sheet patterns UP1 stacked in the third direction D3 and a lower surface of the first sheet pattern placed at the uppermost part.

Figure 26:
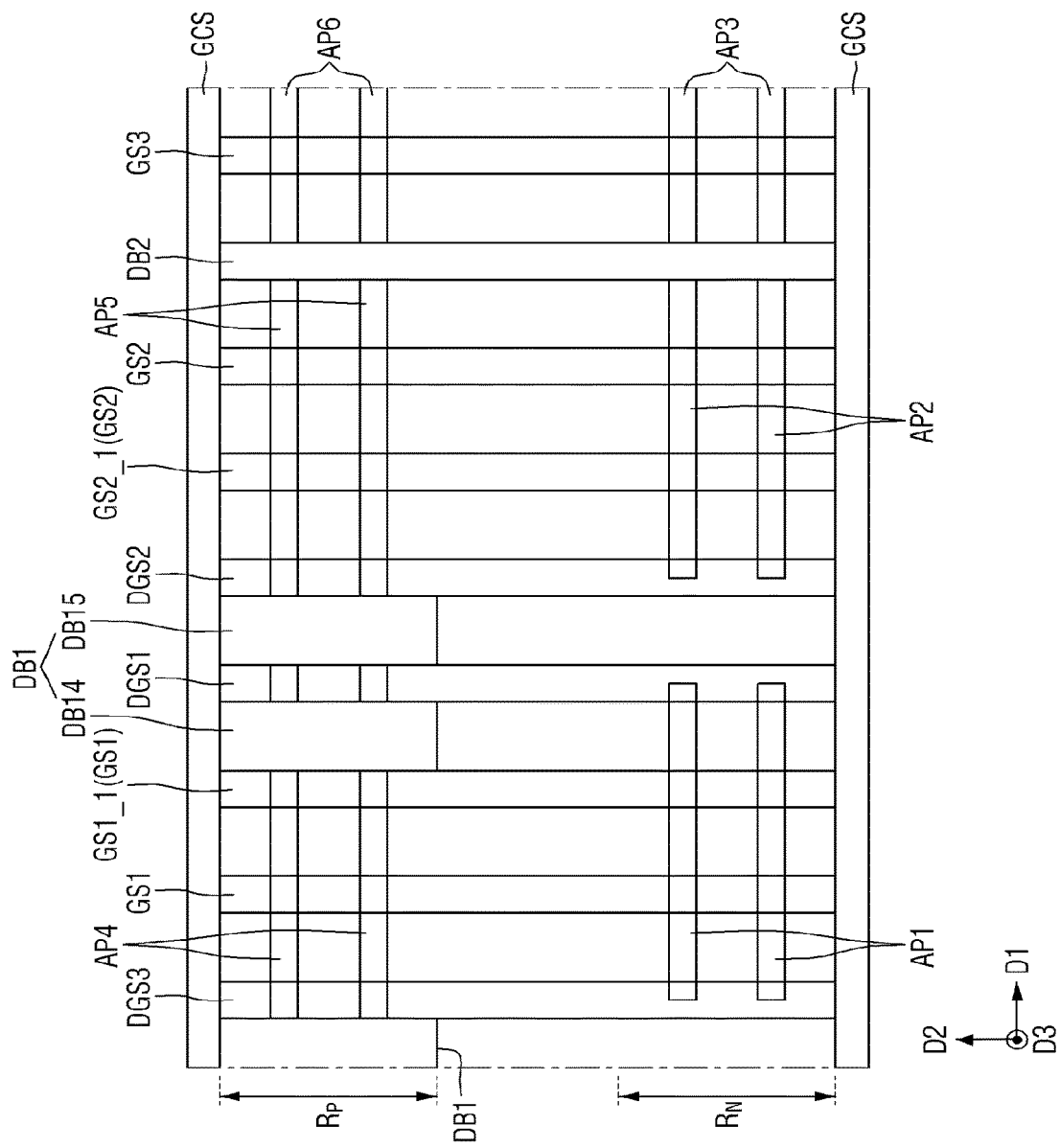
FIG. 26 illustrates a layout diagram of the semiconductor device according to some embodiments of the present disclosure.

FIG. 26 is a layout diagram of a semiconductor device according to some examples. For convenience of explanation, differences from those explained using FIGS. 1 to 6 will be mainly described.

Referring to FIG. 26, in the semiconductor device according to some embodiments, the first element separation structure DB1 may include a fourth element separation pattern DB14 and a fifth element separation pattern DB15.

The fifth element separation pattern DB15 may be between the first dummy gate structure DGS1 and the second dummy gate structure DGS2. In an implementation, the fourth element separation pattern DB14 may be between the first dummy gate structure DGS1 and the first_1 normal gate structure GS1_1. In an implementation, the fourth element separation pattern DB14 of the first element separation structure DB1 may overlap the first active pattern AP1 in the second direction D2.

A portion of the first_1 normal gate structure GS1_1 which intersects the fourth active pattern AP4 may include the dummy insulation gate 225 as shown in FIG. 3 rather than the normal conductive gate (120 of FIG. 3).

FIGS. 27 to 33 illustrate stages in a method for fabricating a semiconductor device according to some embodiments of the present disclosure. FIGS. 27 to 33 are diagrams shown in a cross-sectional view taken along the line B-B of FIG. 1.

Figure 27:
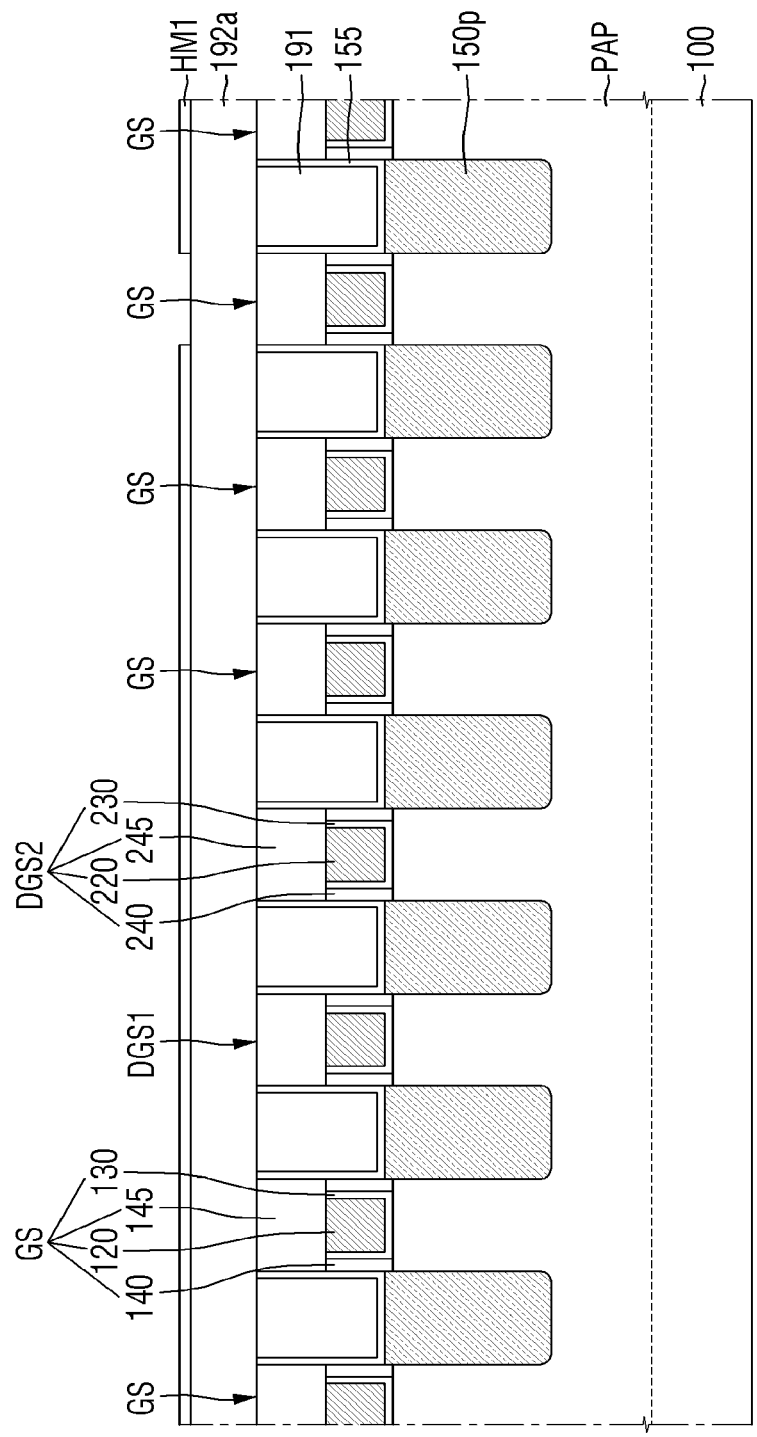
FIGS. 27 to 33 illustrate stages in a method for fabricating a semiconductor device according to some embodiments of the present disclosure.

Referring to FIG. 27, a plurality of pre-gate structures GS, a first dummy gate structure DGS1 and a second dummy gate structure DGS2 may be formed on the first pre-active pattern PAP. A plurality of pre-source/drain patterns 150p may be formed on the first pre-active pattern PAP.

An etching stop film 155 and a first interlayer insulation film 191 may be formed on the plurality of pre-source/drain patterns 150p.

The pre-gate structure GS may include a normal conductive gate 120, a normal gate insulation film 130, a normal gate spacer 140, and a normal gate capping pattern 145.

A first pre-interlayer insulation film 192a and a first hard mask HM1 may be formed on the pre-gate structure GS, the first dummy gate structure DGS1 and the second dummy gate structure DGS2.

Figure 28:
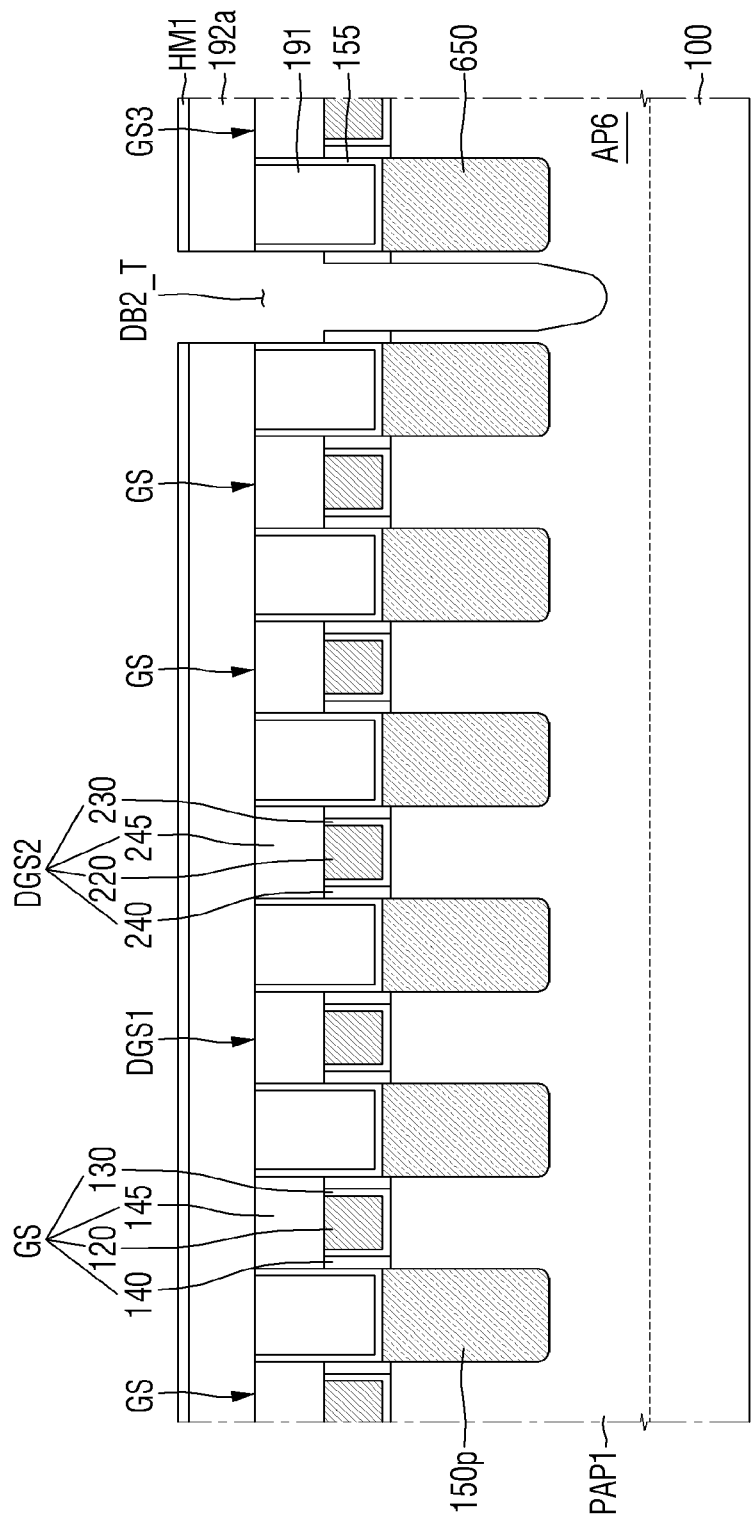

Referring to FIG. 28, the normal conductive gate 120, the normal gate insulation film 130 and the normal gate capping pattern 145 may be removed, using the first hard mask HM1. In addition, a second element separation trench DB2_T may be formed in the first pre-active pattern PAP, using the first hard mask HM1.

The first pre-active pattern PAP may be separated into a first pre-active pattern PAP1 and a sixth active pattern AP6 by the second element separation trench DB2_T.

Figure 29:
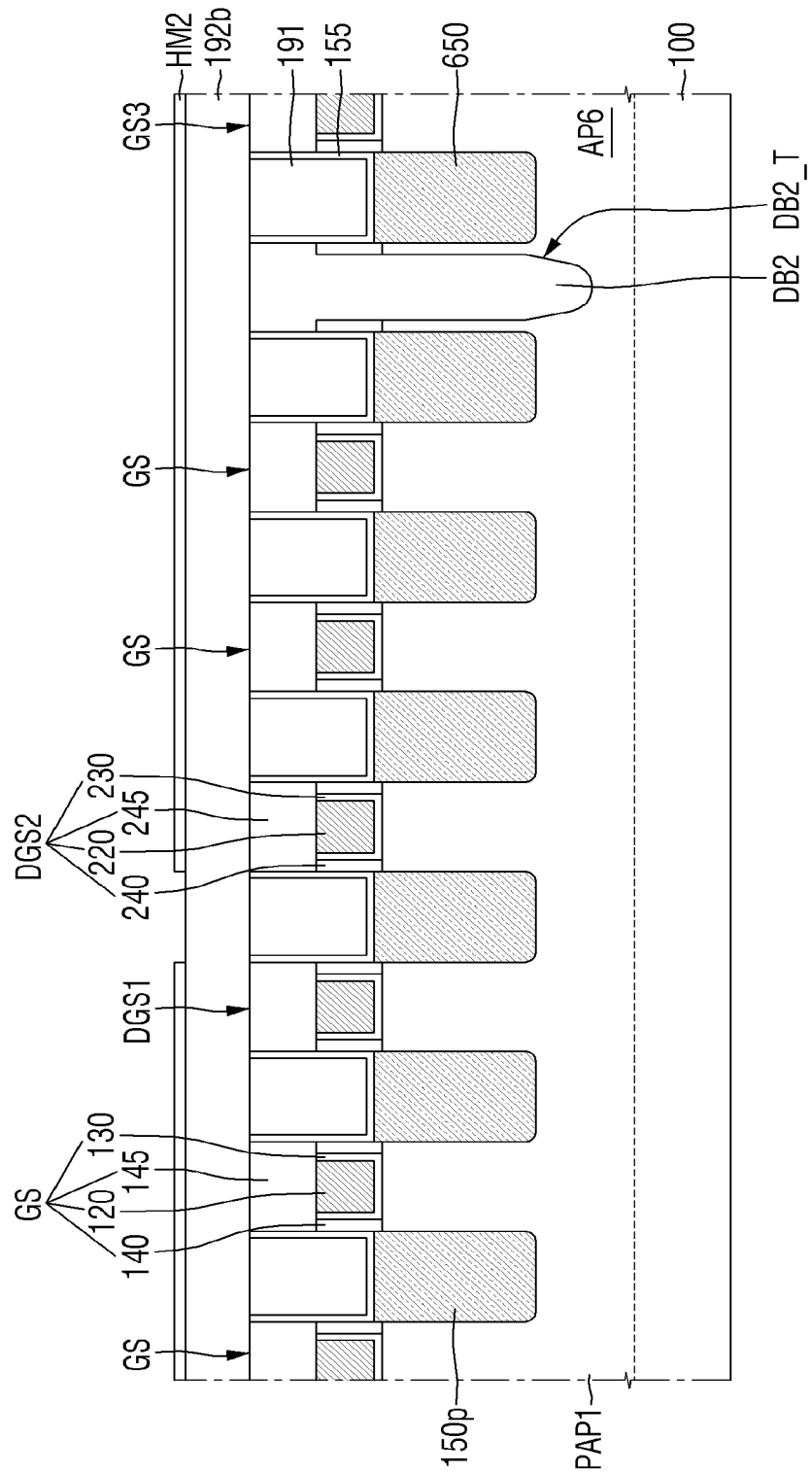

Referring to FIG. 29, a second element separation structure DB2 that fills the second element separation trench DB2_T may be formed.

Subsequently, a second pre-interlayer insulation film 192b and a second hard mask HM2 may be formed on the pre-gate structure GS, the first dummy gate structure DGS1, the second dummy gate structure DGS2 and the second element separation structure DB2.

Figure 30:
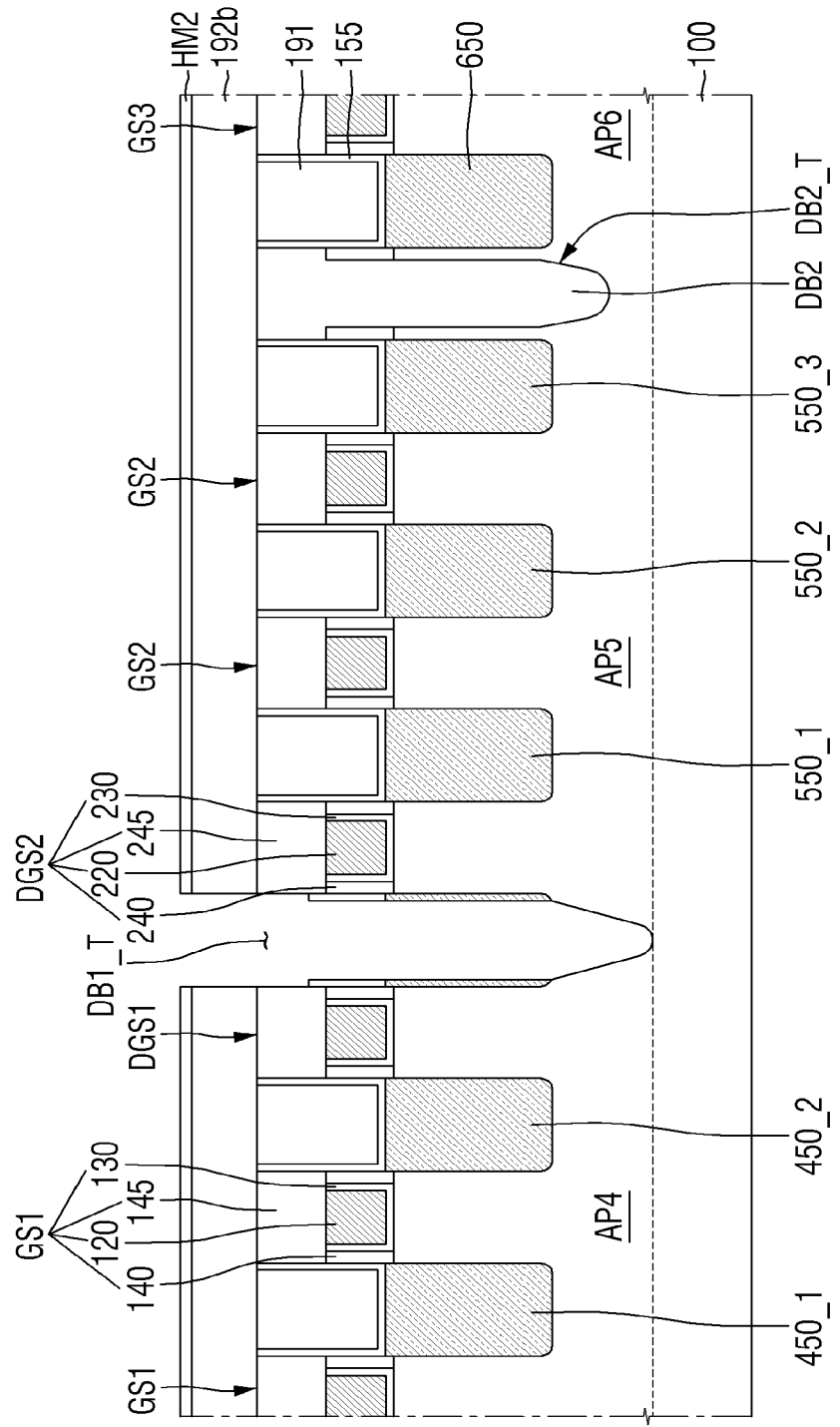

Referring to FIG. 30, the first interlayer insulation film 191 between the first dummy gate structure DGS1 and the second dummy gate structure DGS2 may be removed, using the second hard mask HM2. Further, the first element separation trench DB1_T may be formed in the second pre-active pattern PAP1, using the second hard mask HM2.

At least a part of a pre-source/drain pattern 150p in or between the first dummy gate structure DGS1 and the second dummy gate structure DGS2 may be removed, while the first element separation trench DB1_T is formed.

The second pre-active pattern PAP1 may be separated into a fourth active pattern AP4 and a fifth active pattern AP5 by the second element separation trench DB1_T.

In an implementation, the first element separation trench DB1_T and the second element separation trench DB2_T may be simultaneously formed.

Figure 31:
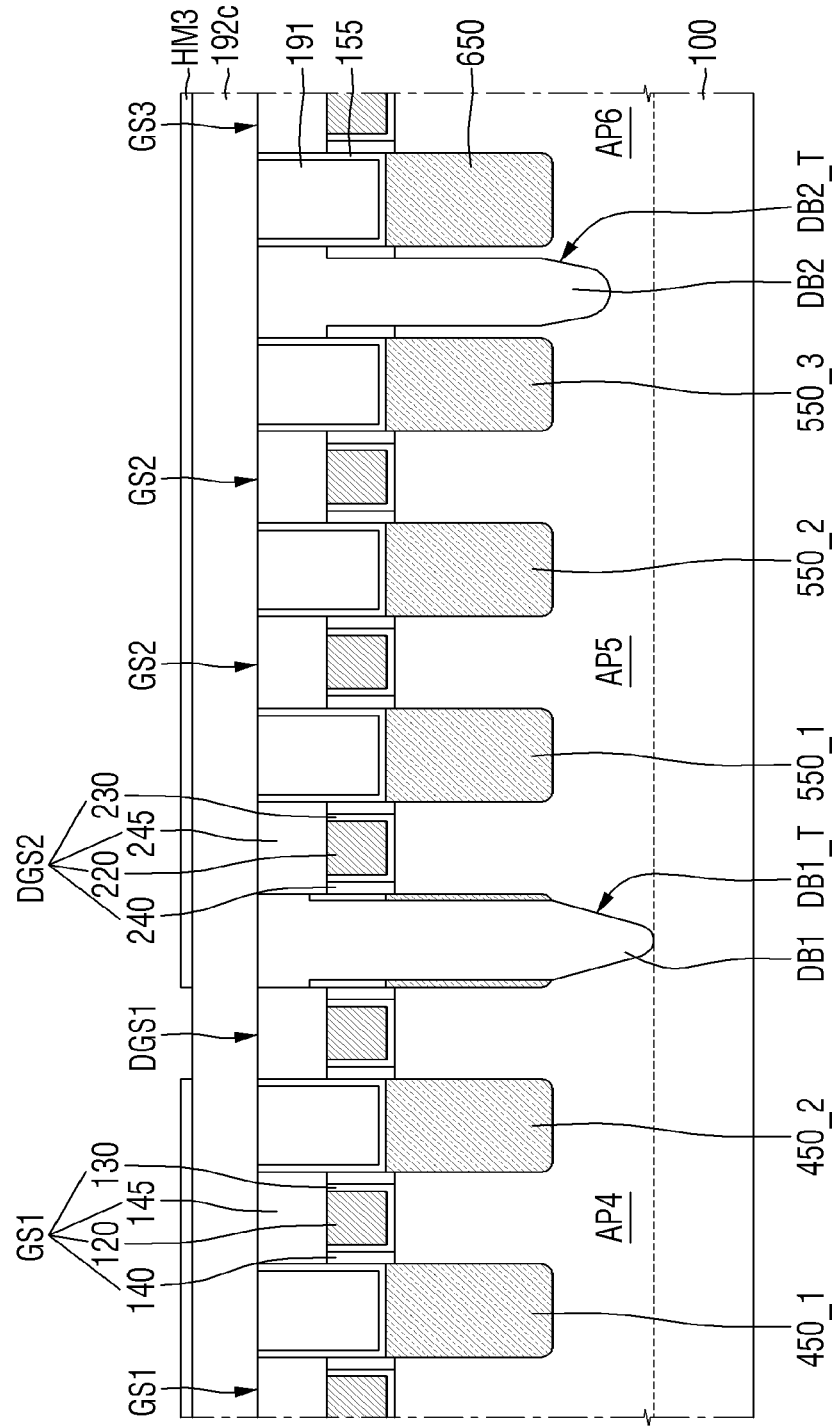

Referring to FIG. 31, the first element separation structure DB1 which fills the first element separation trench DB1_T may be formed.

Subsequently, a third pre-interlayer insulation film 192c and a third hard mask HM3 may be formed on the gate structures GS1 to GS3, the first dummy gate structure DGS1, the second dummy gate structure DGS2, the first element separation structure DB1 and the second element separation structure DB2.

Figure 32:
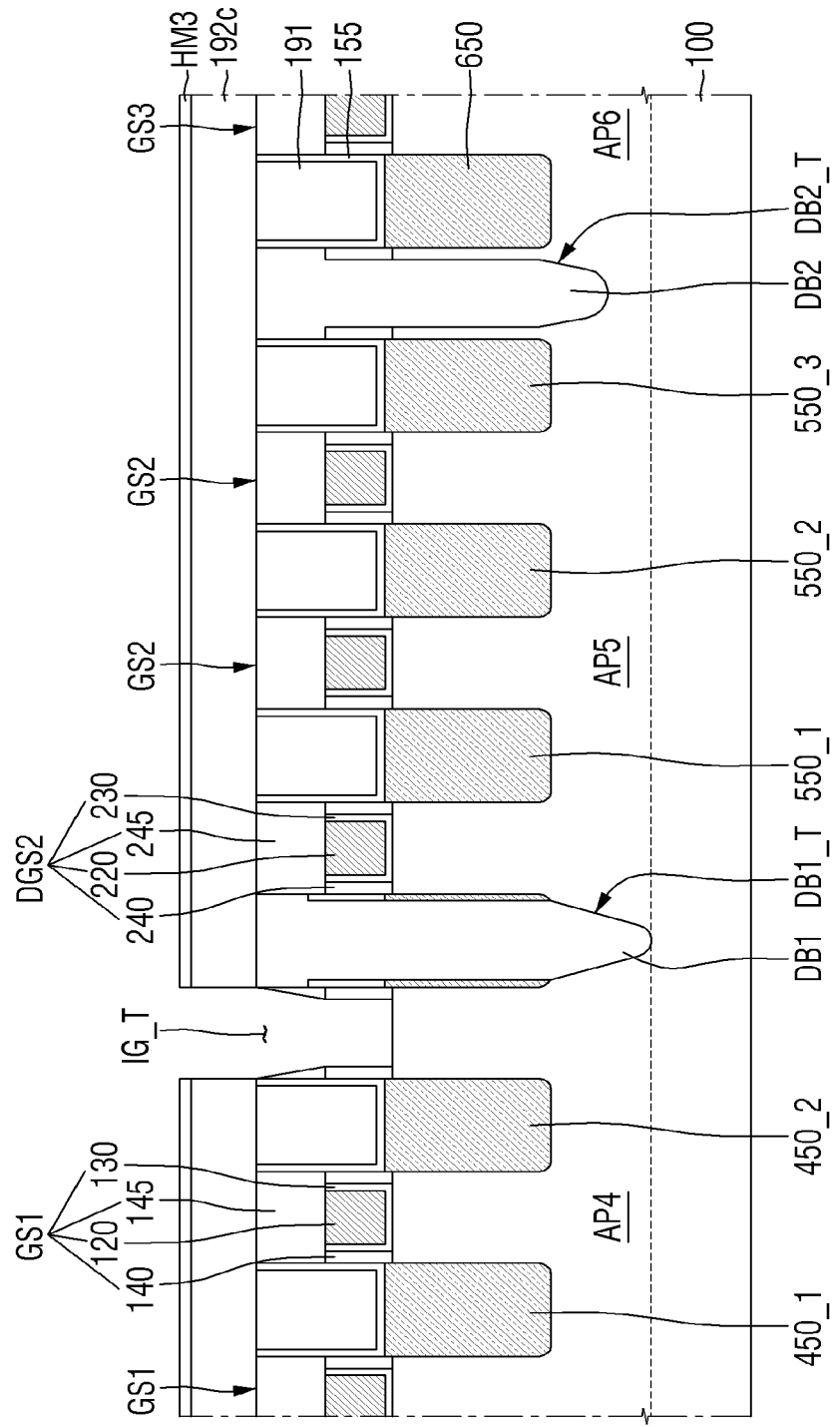

Referring to FIG. 32, the dummy gate insulation film 230 and the dummy conductive gate 220 of the first dummy gate structure DGS1 may be removed, using the third hard mask HM3. The dummy gate insulation film 230 and the dummy conductive gate 220 of the first dummy gate structure DGS1 may be removed to form an insulation gate trench IG_T.

Figure 33:
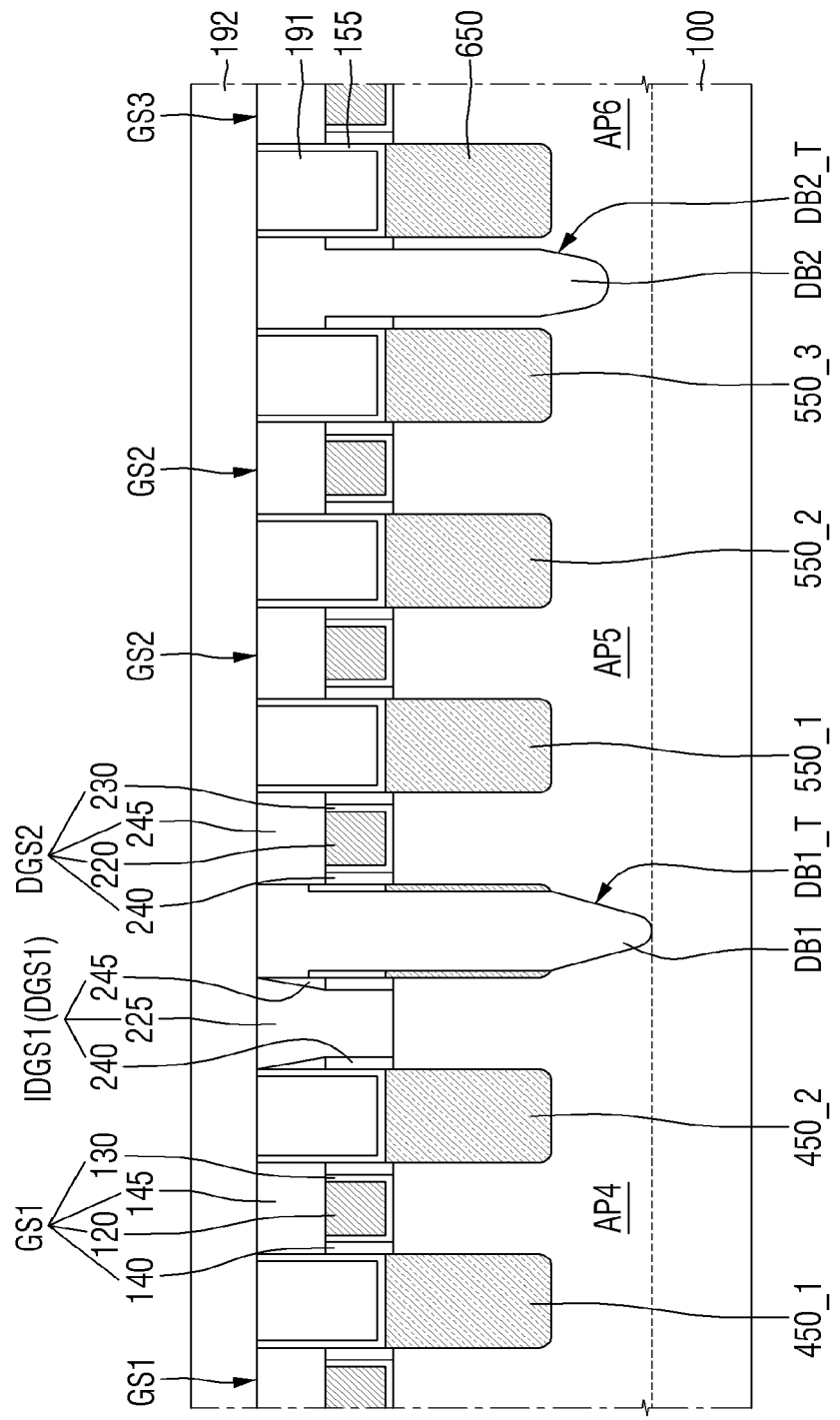

Referring to FIG. 33, a dummy insulation gate 225 that fills the insulation gate trench IG_T may be formed.

As a result, a first insulating dummy structure IDGS1, which includes the dummy insulation gate 225, the dummy gate spacer 240, and the dummy gate capping pattern 245, may be formed on the fourth active pattern AP4.

Subsequently, a second interlayer insulation film 192 may be formed on the dummy insulation gate 225, the first element separation structure DB1 and the second element separation structure DB2.

By way of summation and review, a multi-gate transistor may utilize a three-dimensional channel, and scaling may be easily performed. Further, even if a gate length of the multi-gate transistor is not increased, the current control capability may be improved. Furthermore, it is possible to effectively suppress a SCE (short channel effect) in which potential of a channel region is influenced by a drain voltage.

The embodiments may be realized by providing a semiconductor device in which a degree of integration of elements is increased, and reliability and performance are improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A semiconductor device, comprising:
a substrate including an NMOS formation region and a PMOS formation region;
a field insulation film on the substrate;
a first active pattern and a second active pattern on the NMOS formation region, spaced apart from each other in a first direction by the field insulation film, and each extending in the first direction;
a third active pattern and a fourth active pattern on the PMOS formation region and each extending in the first direction, the third active pattern being spaced apart from the first active pattern in a second direction intersecting the first direction;
a first dummy gate structure on the first active pattern and the third active pattern and extending in the second direction;
a second dummy gate structure on the second active pattern and the fourth active pattern and extending in the second direction;
a normal gate structure extending in the second direction on the third active pattern;
a first source/drain pattern on the third active pattern and between the normal gate structure and the first dummy gate structure; and
a first element separation structure between the first dummy gate structure and the second dummy gate structure and separating the third active pattern and the fourth active pattern,
wherein the first dummy gate structure includes a first dummy insulation gate intersecting the third active pattern, and
wherein a depth from an upper surface of the third active pattern to a lowermost part of the first source/drain pattern is shallower than a depth from an upper surface of the third active pattern to a lowermost part of the first element separation structure.

2. The semiconductor device as claimed in claim 1, further comprising a third dummy gate structure between the first dummy gate structure and the second dummy gate structure,
wherein:
the third dummy gate structure passes between the first active pattern and the second active pattern, and between the third active pattern and the fourth active pattern, and
the first element separation structure includes:
a first sub-element separation pattern between the first dummy gate structure and the third dummy gate structure, and
a second sub-element separation pattern between the third dummy gate structure and the second dummy gate structure.

3. The semiconductor device as claimed in claim 2, wherein:
the third dummy gate structure includes a third dummy conductive gate, and
the third dummy conductive gate passes between the first active pattern and the second active pattern, and between the third active pattern and the fourth active pattern.

4. The semiconductor device as claimed in claim 1, further comprising:
a fifth active pattern spaced apart from the second active pattern in the first direction and extending in the first direction;
a sixth active pattern spaced apart from the fourth active pattern in the first direction and extending in the first direction; and
a second element separation structure extending in the second direction,
wherein the second element separation structure separates the second active pattern from the fifth active pattern, and separates the fourth active pattern from the sixth active pattern.

5. The semiconductor device as claimed in claim 4, wherein a depth from an upper surface of the fourth active pattern to a lowermost part of the second element separation structure is shallower than a depth from the upper surface of the fourth active pattern to a lowermost part of the first element separation structure.

6. The semiconductor device as claimed in claim 4, further comprising:
a second source/drain pattern on the fourth active pattern; and
a third source/drain pattern on the sixth active pattern, wherein:
of the source/drain patterns, the second source/drain pattern is closest to the third source/drain pattern,
the second element separation structure is between the second source/drain pattern and the third source/drain pattern, and
a depth from an upper surface of the fourth active pattern to a lowermost part of the second element separation structure is deeper than a depth from the upper surface of the fourth active pattern to a lowermost part of the second source/drain pattern.

7. The semiconductor device as claimed in claim 1, wherein each of the first active pattern, the second active pattern, the third active pattern, and the fourth active pattern is a fin type pattern.

8. The semiconductor device as claimed in claim 1, wherein each of the first active pattern, the second active pattern, the third active pattern, and the fourth active pattern includes:
a lower active pattern having sidewalls covered with the field insulation film, and
a sheet pattern spaced apart from the lower active pattern.

9. A semiconductor device, comprising:
a first active pattern, a second active pattern, and third active pattern spaced apart from each other and arranged in a horizontal direction;
a first element separation structure separating the first active pattern and the second active pattern;
a second element separation structure that separates the second active pattern and the third active pattern;
at least one first conductive gate on the first active pattern;
at least one second conductive gate on the second active pattern;
a first source/drain pattern on the first active pattern at one side of the at least one first conductive gate; and
a second source/drain pattern on the second active pattern at one side of the at least one second conductive gate,
wherein:
one first conductive gate of the at least one first conductive gate is closest to the first element separation structure in the horizontal direction,
a distance between a width center of the one first conductive gate of the at least one first conductive gate and a width center of the first element separation structure in the horizontal direction is greater than a gate pitch,
a height of an upper surface of the first element separation structure in a vertical direction from an upper surface of the first active pattern is the same as or higher than a height of an upper surface of the at least one first conductive gate in the vertical direction from the upper surface of the first active pattern,
at least one third conductive gate on the third active pattern,
a third source/drain pattern at both sides of the at least one third conductive gate on the third active pattern,
the second element separation structure is between the second source/drain pattern and the third source/drain pattern,
a second conductive gate is not between the second element separation structure and the second source/drain pattern, and
a third conductive gate is not between the second element separation structure and the third source/drain pattern.

10. The semiconductor device as claimed in claim 9, further comprising an etching stop film is along a part of a sidewall of the first element separation structure and is not on a sidewall of the second element separation structure.

11. The semiconductor device as claimed in claim 9, further comprising a part of a source/drain pattern on the sidewall of the first element separation structure.

12. The semiconductor device as claimed in claim 9, further comprising a first dummy insulation gate on the upper surface of the first active pattern between the first element separation structure and the one first conductive gate.

13. The semiconductor device as claimed in claim 12, wherein the first dummy insulation gate is in contact with the first active pattern.

14. The semiconductor device as claimed in claim 13, further comprising a gate insulation film including a high-dielectric constant insulating material,
wherein:
the first dummy insulation gate includes:
an insulation liner, and
a filling insulation pattern that fills a space defined by the insulation liner,
the one first conductive gate is disposed on the gate insulation film, and
the insulation liner includes the same material as the gate insulation film.

15. A semiconductor device, comprising:
a field insulation film;
a first lower active pattern and a second lower active pattern spaced apart from each other in a first direction by the field insulation film, each of the first lower active pattern and the second lower active pattern extending in the first direction;
a first sheet pattern spaced apart from the first lower active pattern on the first lower active pattern;
a second sheet pattern spaced apart from the second lower active pattern on the second lower active pattern;
a third lower active pattern spaced apart from the first lower active pattern in a second direction intersecting the first direction, the third lower active pattern extending in the first direction;
a fourth lower active pattern spaced apart from the third lower active pattern in the first direction and extending in the first direction;
a third sheet pattern spaced apart from the third lower active pattern on the third lower active pattern;
a fourth sheet pattern spaced apart from the fourth lower active pattern on the fourth lower active pattern;
a first dummy gate structure on the first lower active pattern and the third lower active pattern and extending in the second direction;
a second dummy gate structure on the second lower active pattern and the fourth lower active pattern and extending in the second direction; and
a first element separation structure between the first dummy gate structure and the second dummy gate structure, the first element separation structure separating the third lower active pattern and the fourth lower active pattern,
wherein:
the first dummy gate structure includes a first dummy insulation gate that intersects the third lower active pattern and a first dummy conductive gate that intersects the first lower active pattern,
the first dummy insulation gate wraps the third sheet pattern, and
the first dummy conductive gate wraps the first sheet pattern.

16. The semiconductor device as claimed in claim 15, further comprising:
a normal gate structure extending in the second direction on the first lower active pattern and on the third lower active pattern,
a source/drain pattern on the third lower active pattern and between the normal gate structure and the first dummy gate structure, and
a source/drain contact connected to the source/drain pattern.

17. The semiconductor device as claimed in claim 16, wherein at least a part of the source/drain contact is inserted into the source/drain pattern.

18. The semiconductor device as claimed in claim 15, further comprising:
a fifth lower active pattern spaced apart from the second lower active pattern in the first direction and extending in the first direction,
a sixth lower active pattern spaced apart from the fourth lower active pattern in the first direction and extending in the first direction,
a fifth sheet pattern spaced apart from the fifth lower active pattern on the fifth lower active pattern,
a sixth sheet pattern spaced apart from the sixth lower active pattern on the sixth lower active pattern, and
a second element separation structure extending in the second direction,
wherein the second element separation structure separates the second lower active pattern and the fifth lower active pattern, and separates the fourth lower active pattern and the sixth lower active pattern.

19. The semiconductor device as claimed in claim 18, further comprising a sheet pattern on a part of a sidewall of the second element separation structure.

20. The semiconductor device as claimed in claim 18, further comprising an inner spacer on a part of a sidewall of the second element separation structure.

* * * * *